United States Patent
Lee et al.

(10) Patent No.: US 11,805,661 B2
(45) Date of Patent: Oct. 31, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chien-Min Lee, Hsinchu County (TW); Tung-Ying Lee, Hsinchu (TW); Cheng-Hsien Wu, Hsinchu (TW); Xinyu Bao, Fremont, CA (US); Hengyuan Lee, Hsinchu (TW); Ying-Yu Chen, Yilan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 17/241,071

(22) Filed: Apr. 27, 2021

(65) Prior Publication Data
US 2022/0069012 A1 Mar. 3, 2022

Related U.S. Application Data

(60) Provisional application No. 63/070,833, filed on Aug. 27, 2020.

(51) Int. Cl.
*H01L 27/24* (2006.01)
*H01L 45/00* (2006.01)
*H10B 63/00* (2023.01)
*H10N 70/00* (2023.01)
*H10N 70/20* (2023.01)

(52) U.S. Cl.
CPC ........... *H10B 63/24* (2023.02); *H10B 63/80* (2023.02); *H10N 70/011* (2023.02); *H10N 70/231* (2023.02)

(58) Field of Classification Search
None
See application file for complete search history.

(56) References Cited

U.S. PATENT DOCUMENTS

| 10,418,552 B1* | 9/2019 | Fantini | H01L 27/2427 |
| 2018/0277601 A1* | 9/2018 | Ahn | H01L 45/143 |
| 2020/0066794 A1* | 2/2020 | Yasuda | H01L 27/2463 |
| 2020/0295083 A1* | 9/2020 | Cheng | H01L 27/2427 |

\* cited by examiner

*Primary Examiner* — Mounir S Amer
(74) *Attorney, Agent, or Firm* — JCIPRNET

(57) ABSTRACT

A semiconductor device includes a semiconductor substrate and an interconnection structure. The interconnection structure is disposed over the semiconductor substrate. The interconnection structure includes first conductive lines, second conductive lines, and ovonic threshold switches. The first conductive lines extend parallel to each other in a first direction. The second conductive lines are stacked over the first conductive lines and extend parallel to each other in a second direction perpendicular to the first direction. The ovonic threshold switches are disposed between the first conductive lines and the second conductive lines. The ovonic threshold switches include a ternary GeCTe material. The ternary GeCTe material consists substantially of carbon, germanium, and tellurium. In the ternary GeCTe material, a content of carbon is in a range from 10 to 30 atomic percent and a content of germanium is in a range from 10 to 65 atomic percent.

20 Claims, 33 Drawing Sheets

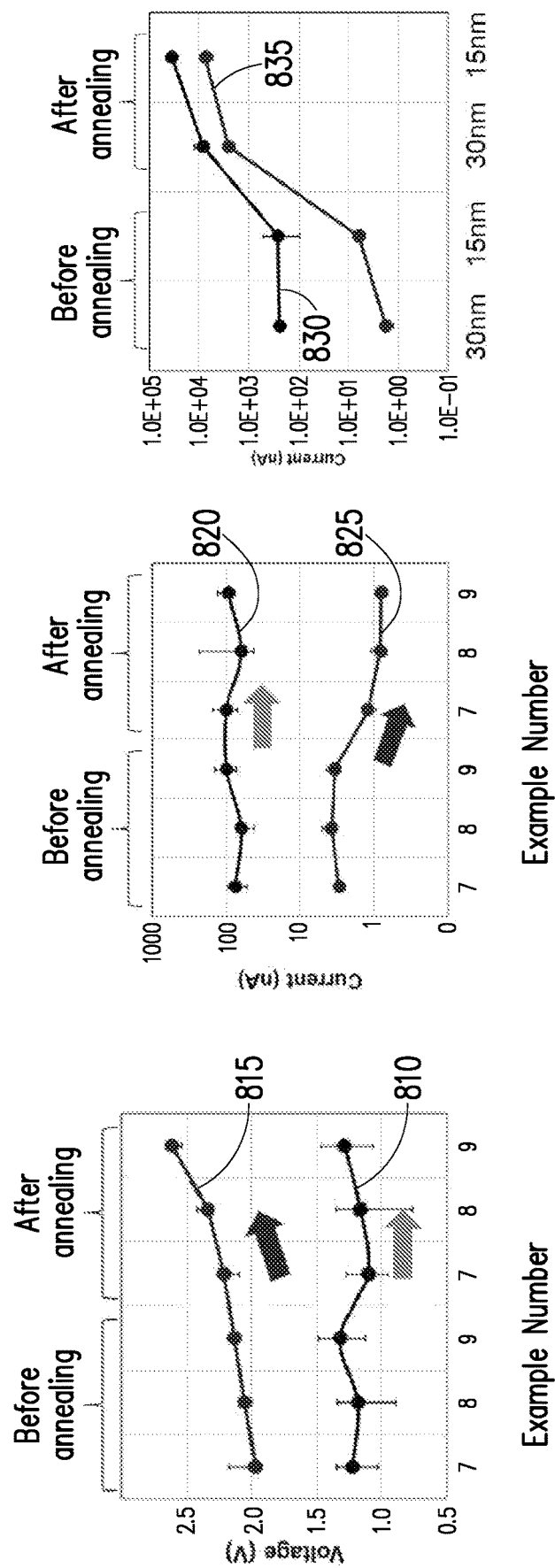

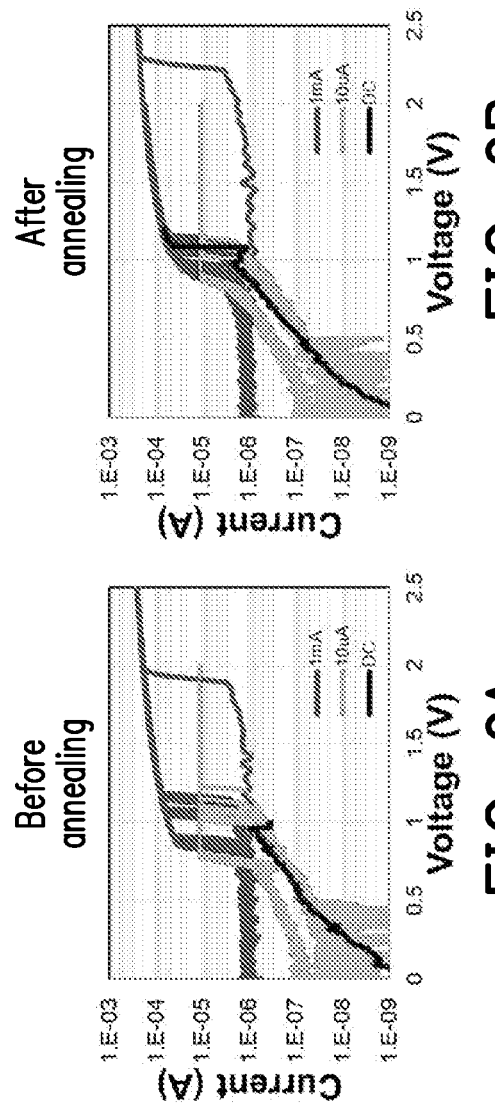
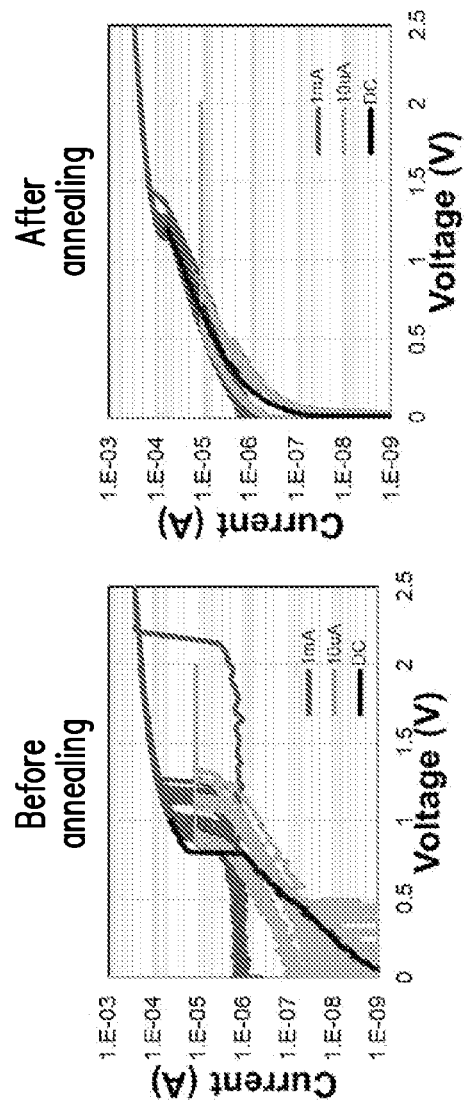
FIG. 9A FIG. 9B FIG. 9C FIG. 9D

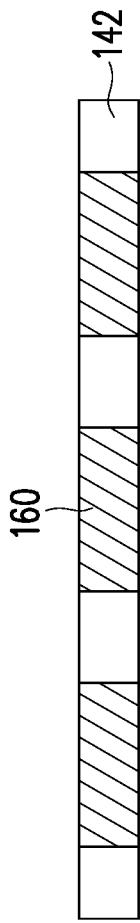
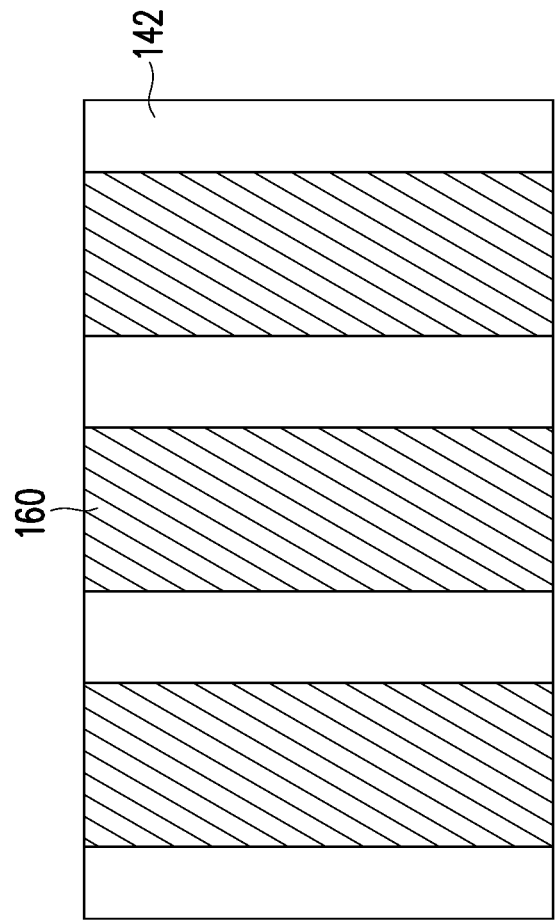
FIG. 12A
FIG. 12B

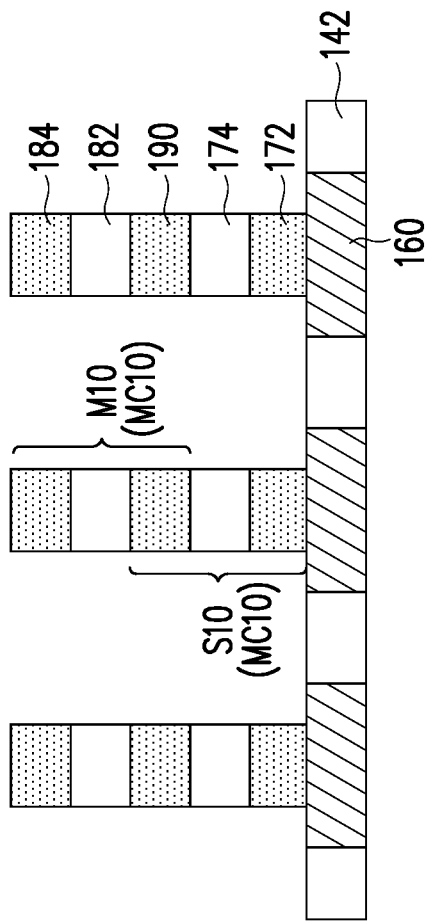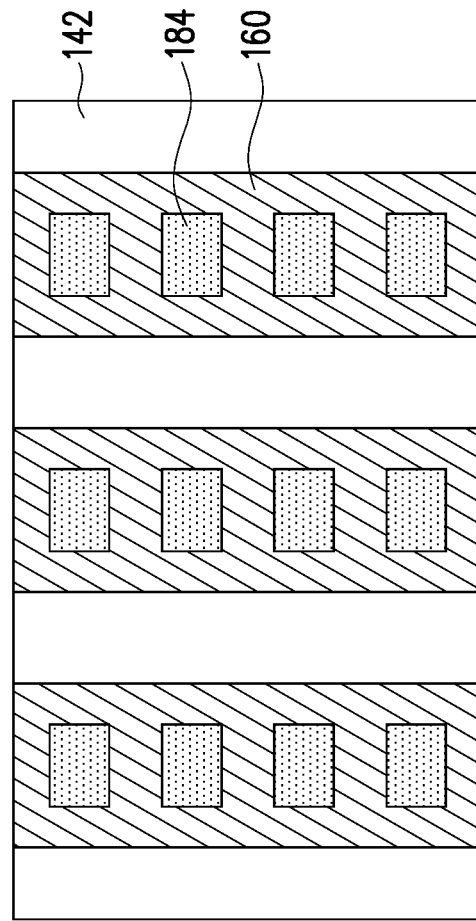

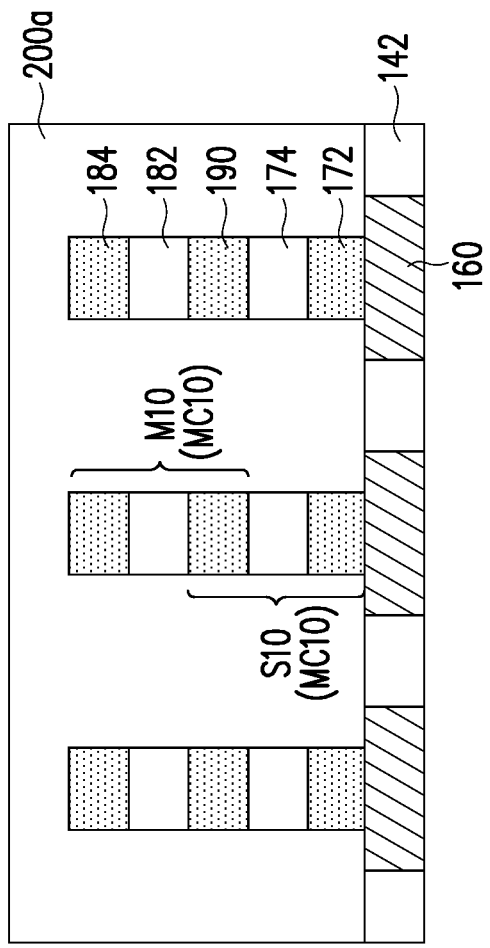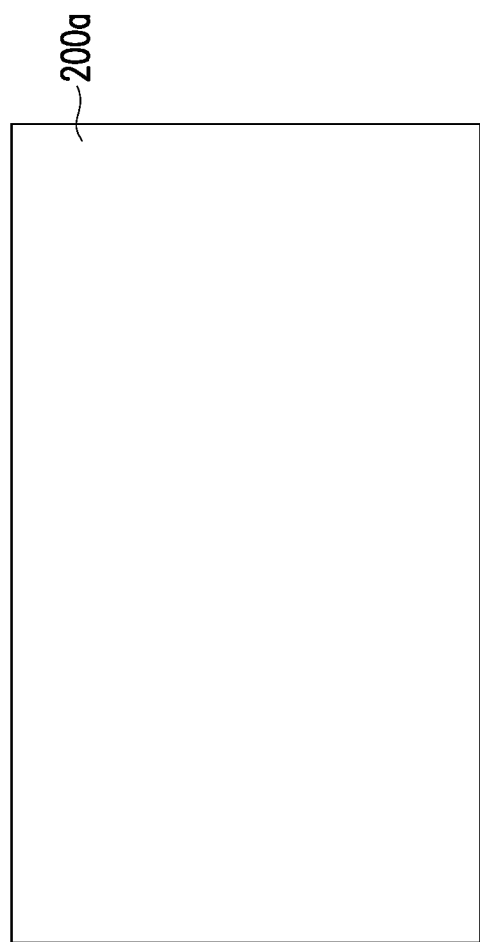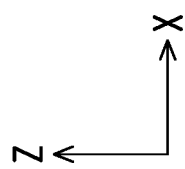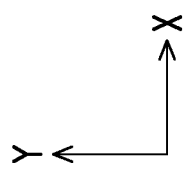

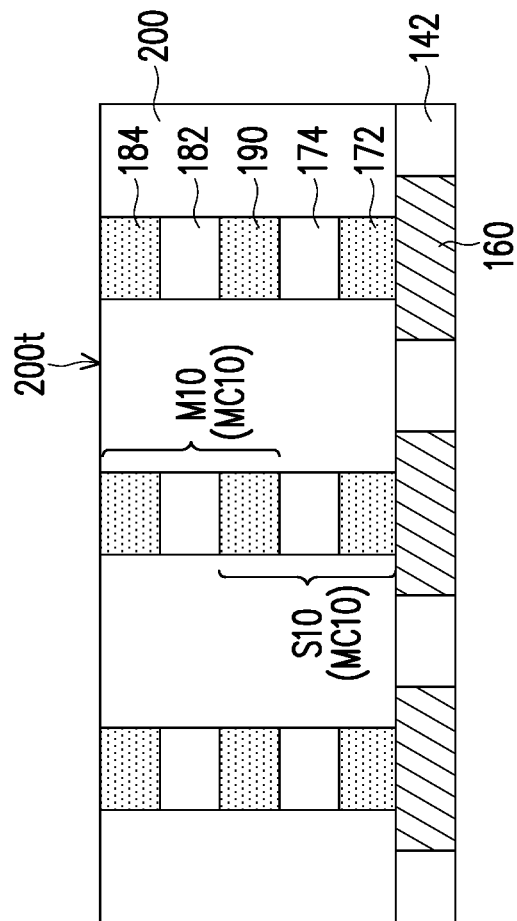
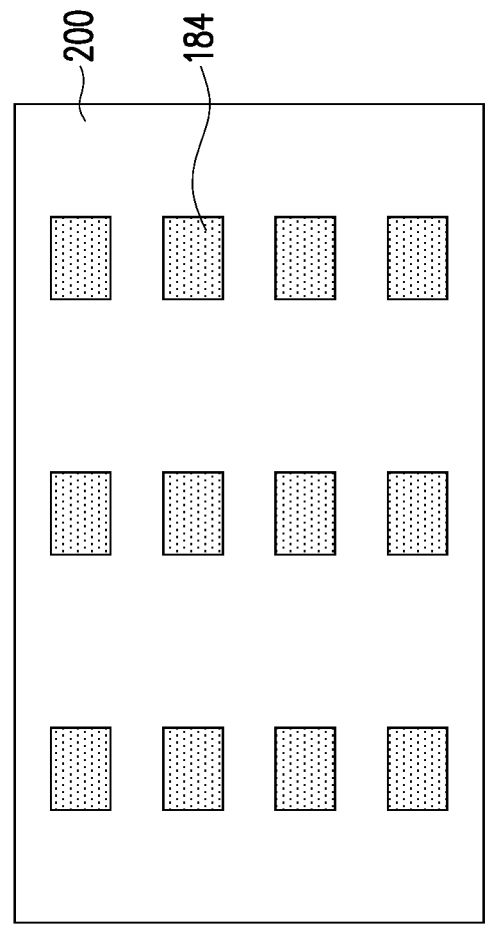
FIG. 17A
FIG. 17B

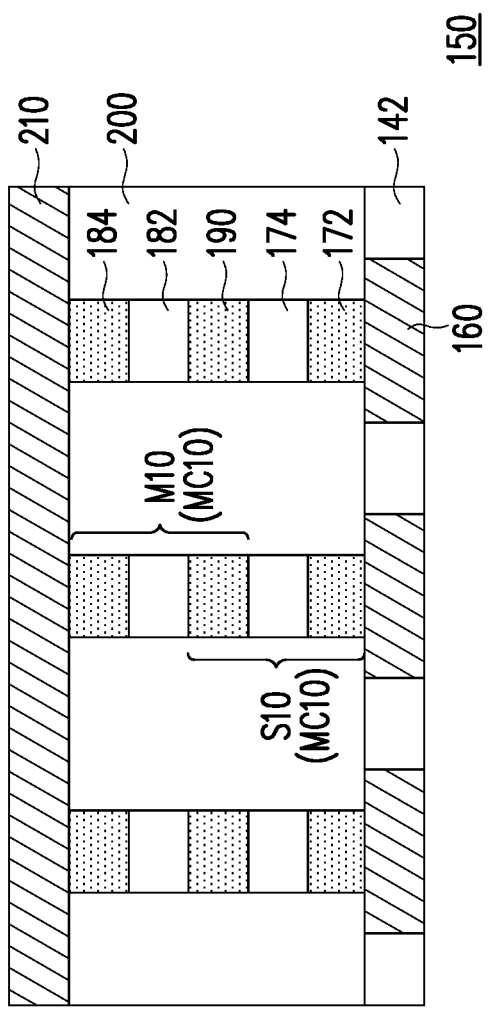
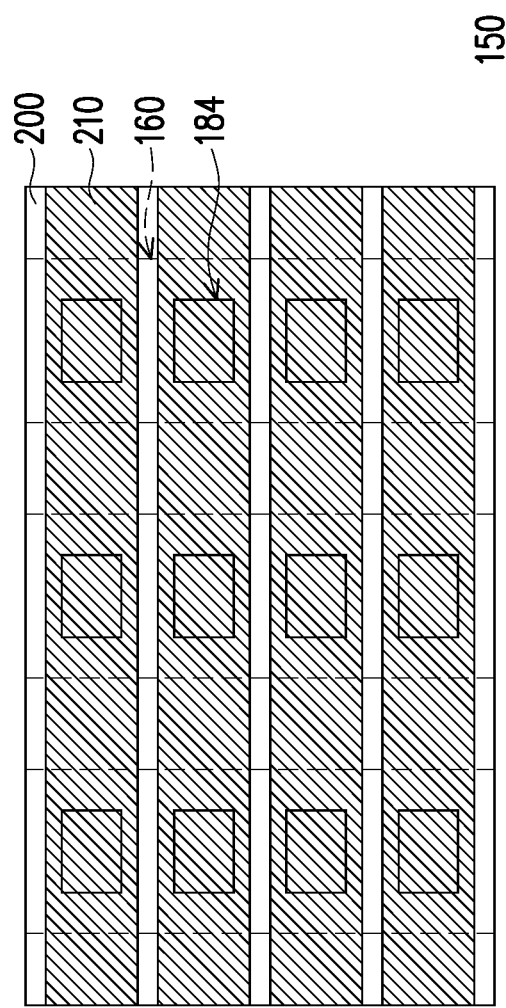
FIG. 18A
FIG. 18B

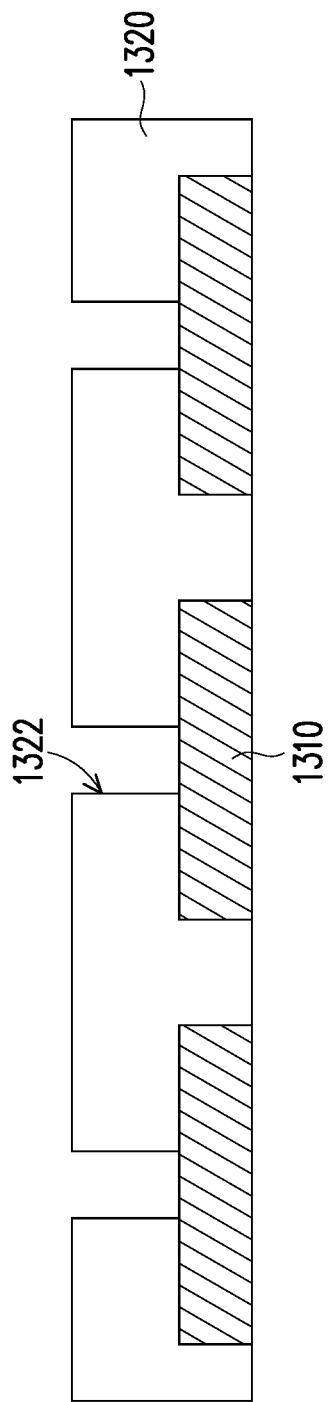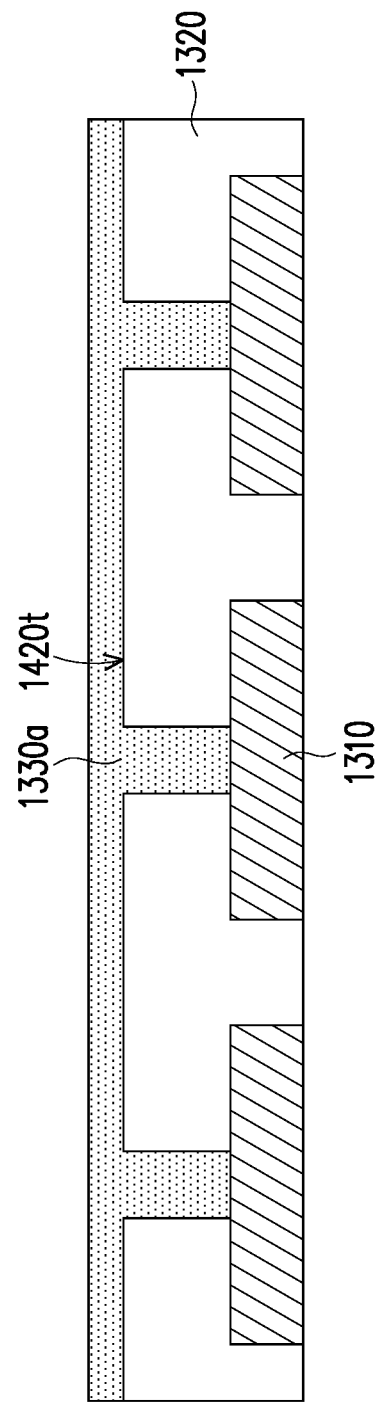

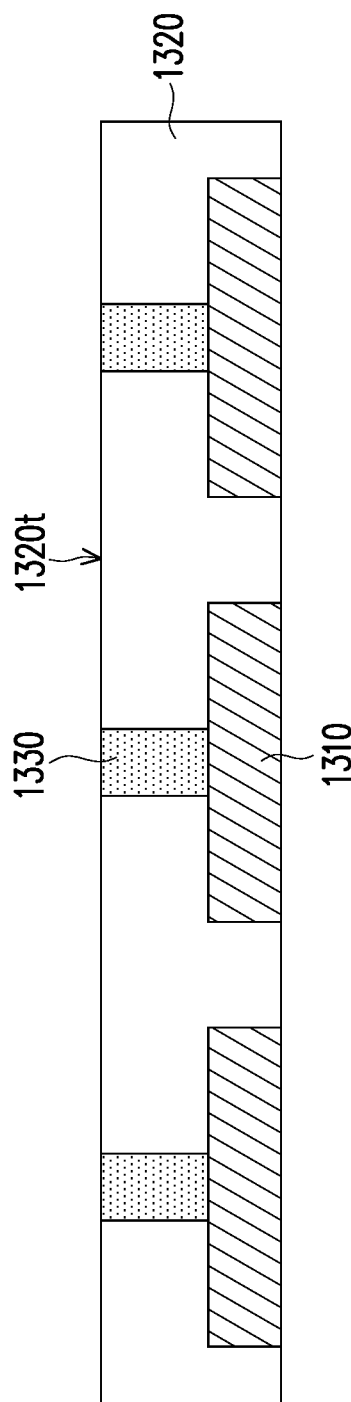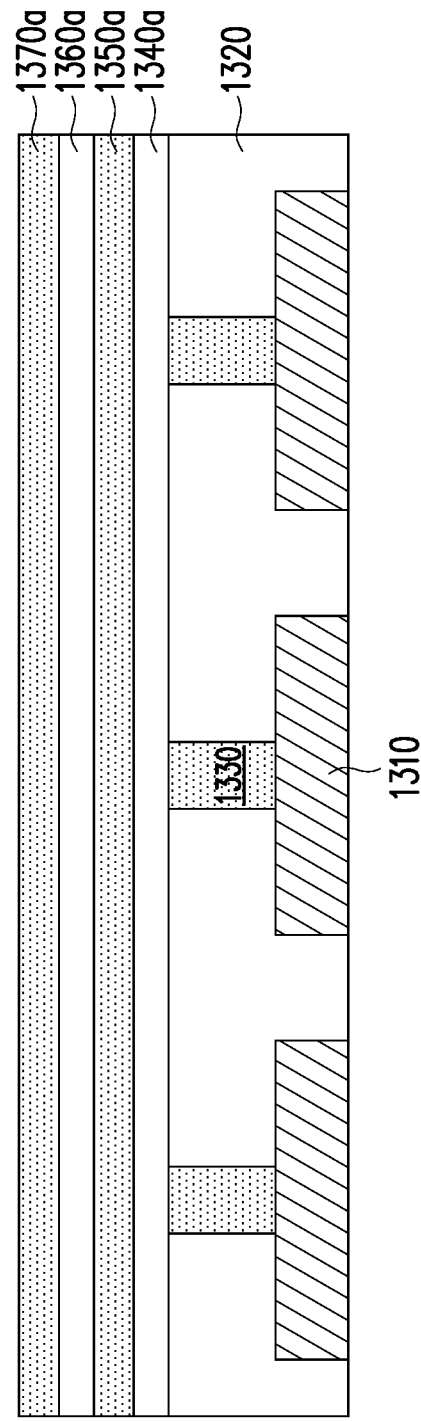

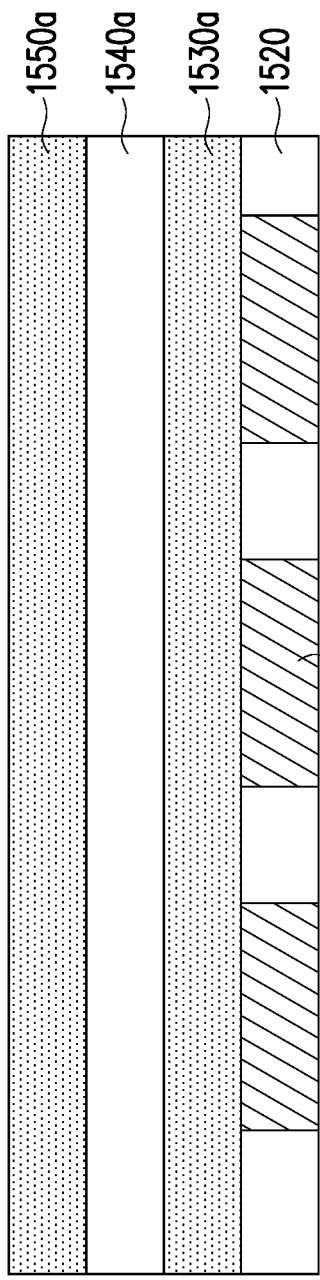
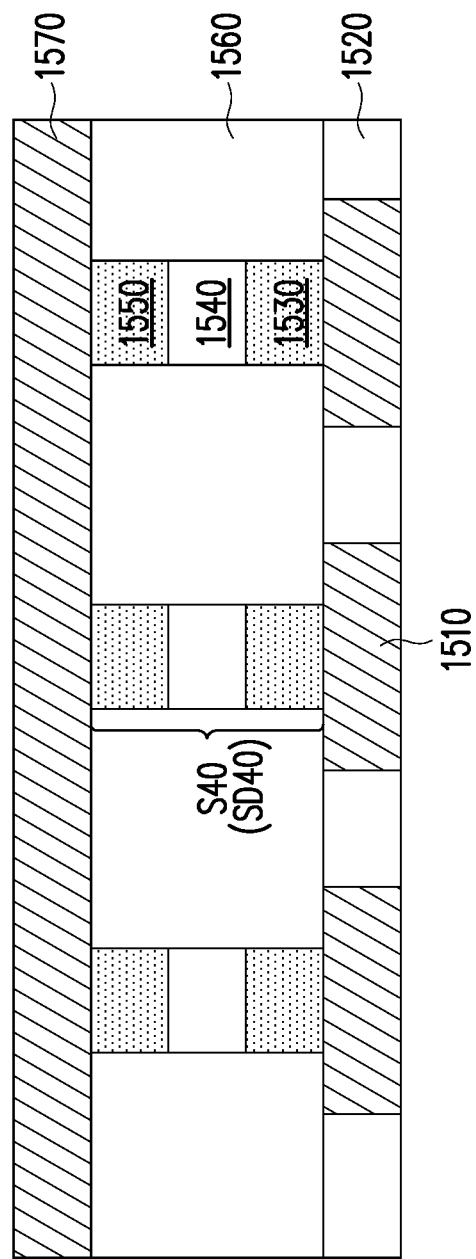
FIG. 21A
FIG. 21B

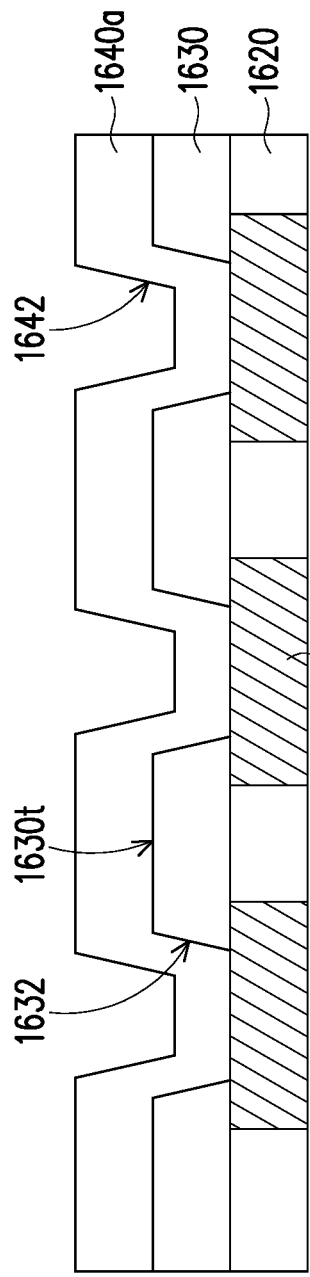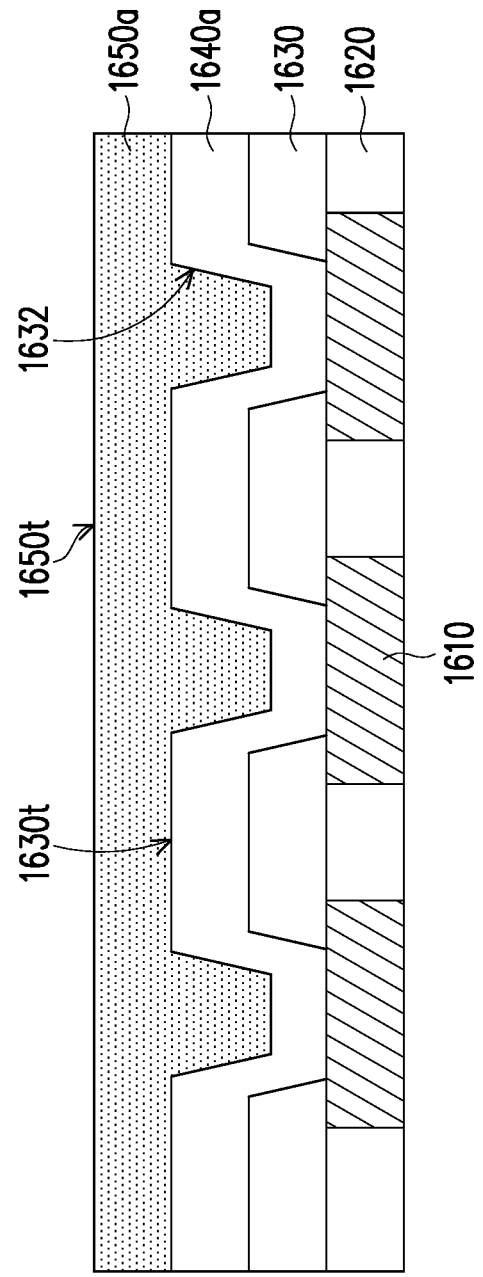

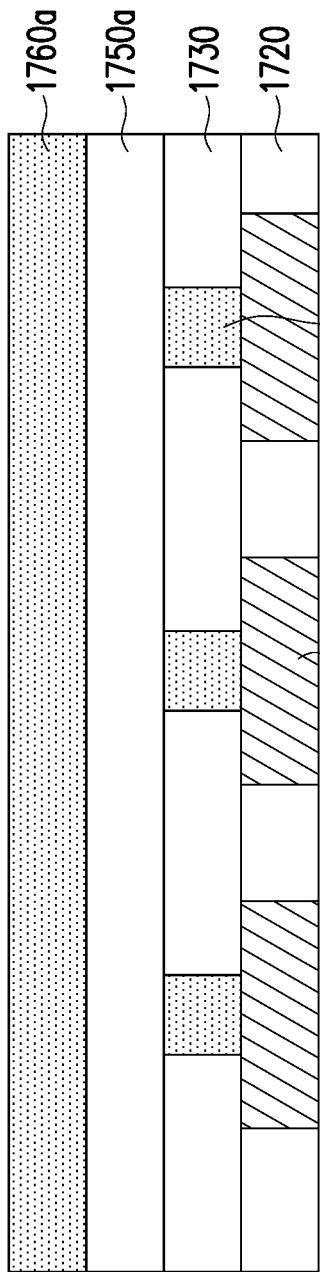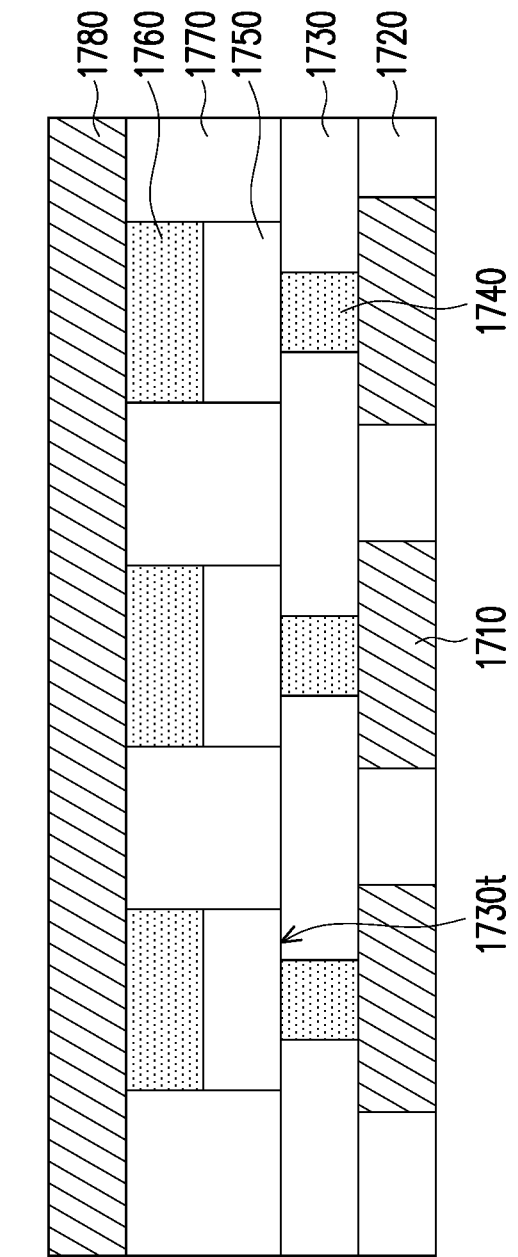

SEMICONDUCTOR DEVICE AND MANUFACTURING METHOD THEREOF

CROSS-REFERENCE

The present application claims the priority benefit of U.S. Provisional Application No. 63/070,833, filed on Aug. 27, 2020. The entirety of the above-mentioned patent application is hereby incorporated by reference herein and made a part of this specification.

BACKGROUND

Semiconductor devices are used in integrated circuits for electronic applications, including radios, televisions, cell phones, and personal computing devices, as examples. To respond to the increasing demand for miniaturization, higher speed, and better electrical performance (e.g., lower power consumption, increased reliability) new structures and materials are actively researched. For example, in memory devices selectors are provided to selectively address associated memory cells, and active research is conducted on materials for memory layers, selector layers, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A to FIG. 10K are charts plotting characterization data of some materials according to some embodiments of the disclosure.

FIG. 12A to FIG. 18A are schematic cross-sectional views of structures formed during a manufacturing method of a semiconductor device according to some embodiments of the disclosure.

FIG. 12B to FIG. 18B are top views of the structures of FIG. 12A to FIG. 18A, respectively, according to some embodiments of the disclosure.

FIG. 19A to FIG. 19G are schematic cross-sectional views of structures formed during a manufacturing method of a semiconductor device according to some embodiments of the disclosure.

FIG. 21A and FIG. 21B are schematic cross-sectional views of structures formed during a manufacturing method of a semiconductor device according to some embodiments of the disclosure.

FIG. 22A to FIG. 22C are schematic cross-sectional views of structures formed during a manufacturing method of a semiconductor device according to some embodiments of the disclosure.

FIG. 23A and FIG. 23B are schematic cross-sectional views of structures formed during a manufacturing method of a semiconductor device according to some embodiments of the disclosure.

DETAILED DESCRIPTION

Figure 1:
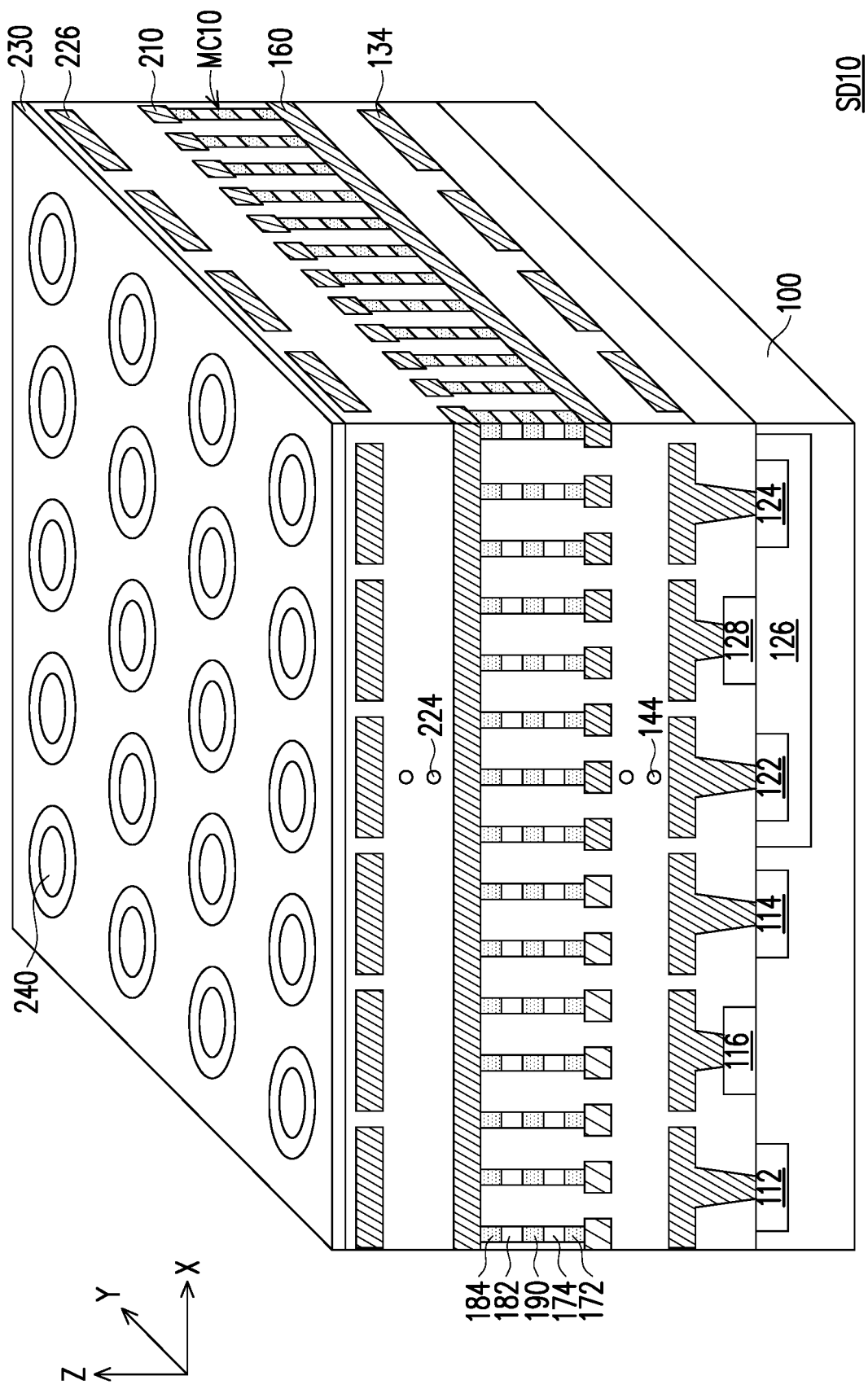
FIG. 1 is a schematic perspective view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
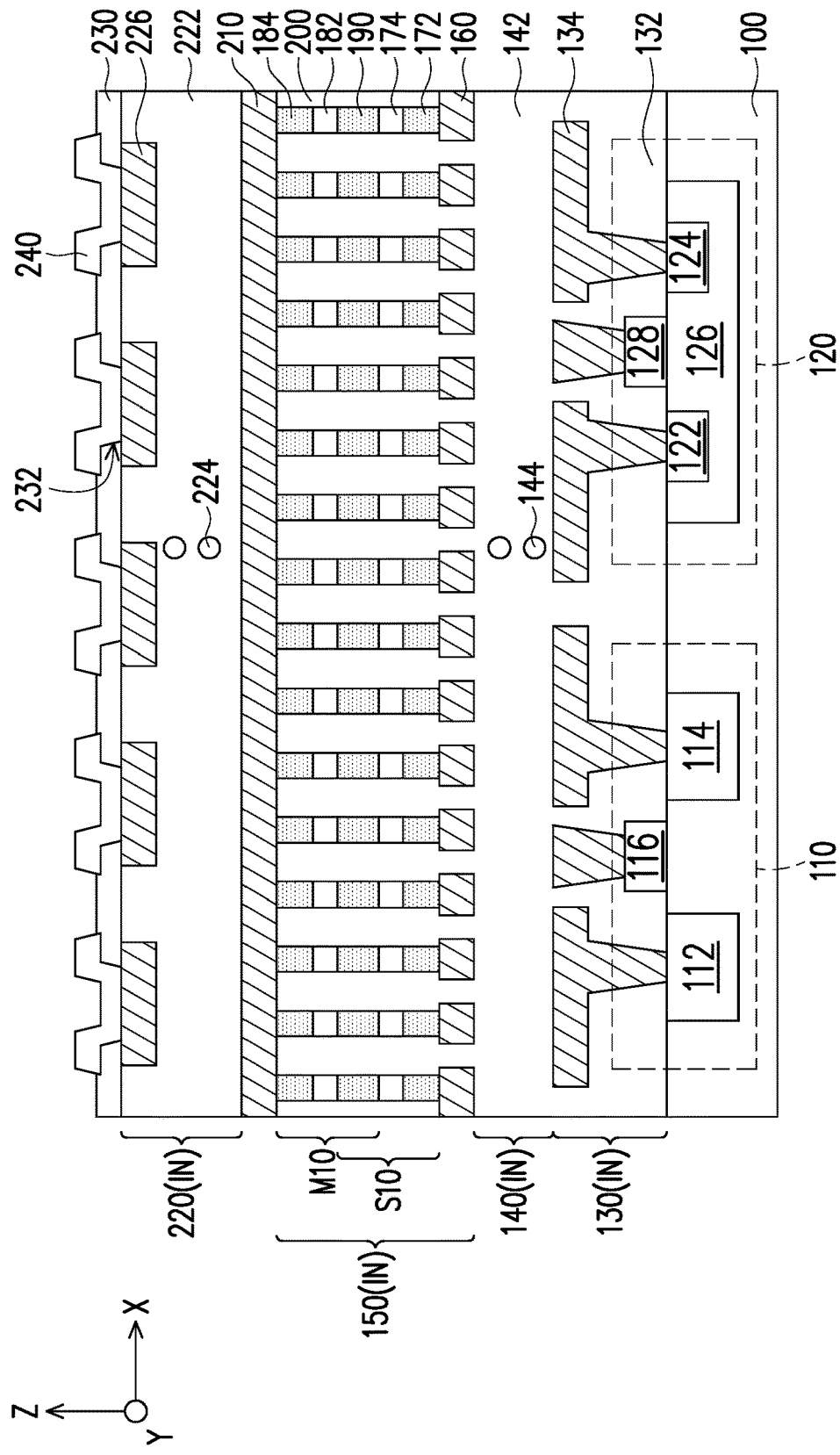
FIG. 2 is a schematic cross-sectional view of a semiconductor device according to some embodiments of the disclosure.

FIG. 1 is a schematic perspective view of a semiconductor device SD10 according to some embodiments of the disclosure. FIG. 2 is a schematic cross-sectional view of the semiconductor device SD10 according to some embodiments of the disclosure. The view of FIG. 2 may be taken in an XZ plane, where the X, Y, and Z directions form a set of orthogonal Cartesian coordinates. In some embodiments, the semiconductor device SD10 includes a semiconductor substrate 100 and an interconnection structure IN formed on the semiconductor substrate 100. In some embodiments, the semiconductor substrate 100 includes one or more semiconductor materials, which may be elemental semiconductor materials, compound semiconductor materials, or semiconductor alloys. For instance, the elemental semiconductor material may include Si or Ge. The compound semiconductor materials and the semiconductor alloys may respectively include SiGe, SiC, SiGeC, a III-V semiconductor, a II-VI semiconductor, or semiconductor oxide materials. For example, the semiconductor oxide materials may be one or more of ternary or higher (e.g., quaternary and so on) semiconductor oxides, such as indium gallium zinc oxide (IGZO), indium zinc oxide (IZO), or indium tin oxide (ITO). In some embodiments, the semiconductor substrate 100 may be a semiconductor-on-insulator, including at least one layer of dielectric material (e.g., a buried oxide layer) disposed between a pair of semiconductor layers. FIG. 1 and FIG. 2 further illustrate functional circuits that may be formed over the semiconductor substrate 100. For example, a transistor 110 and a transistor 120 are illustrated on the semiconductor substrate 100. The transistor 110 may include a pair of source and drain regions 112, 114 embedded in the semiconductor substrate 100, separated from each other by a portion of semiconductor substrate 100 which functions as a channel region of the transistor 110. A gate structure 116 is disposed on the channel region in between the source and drain regions 112, 114. In some embodiments, the source and drain regions 112, 114 may be doped, for example with n-type materials or p-type materials. In some embodiments, the transistor 120 may also include a pair of source and drain regions 122, 124, which may be optionally doped with n-type materials or p-type materials. In some embodiments, the source and drain regions 122, 124 are doped with materials of opposite conductivity type with respect to the source and drain regions 112, 114.

In some embodiments, the source and drain regions 122, 124 may be embedded in a region 126 of different composition. For example, the region 126 may be doped with a material of opposite conductivity type with respect to the source and drain regions 122, 124, or the region 126 may include a same dopant as the source and drain regions 122, 124, but in different concentration. For example, the source and drain regions 122, 124 may be doped with a p-type material, and the region 126 may be doped with an n-type material. In some embodiments, a gate structure 128 is disposed on the region 126 in between the source and drain regions 122, 124. It should be noted that the disclosure does not limit the architecture of the transistors 110, 120. For example, the transistors 110, 120 may be planar field effect transistors, fin field effect transistors, gate all around transistors, or any other transistor architecture. Furthermore, different gate contact schemes, such as front-gate, back-gate, double-gate, staggered, are contemplated within the scope of the disclosure. Although in FIGS. 1 and 2 are illustrated transistors 110, 120 formed over the semiconductor substrate 100, other active devices (e.g., diodes or the like) and/or passive devices (e.g., capacitors, resistors, or the like) may also be formed as part of the functional circuit.

The interconnection structure IN may be formed over the semiconductor substrate 100 to integrate the circuit devices formed on the semiconductor substrate 100 in one or more functional circuits. For example, a bottommost interconnection tier 130 of the interconnection structure IN may include an interlayer dielectric (ILD) 132 formed on the semiconductor substrate 100, extending on the transistors 110, 120 and on other circuit devices which may be formed on the semiconductor substrate 100. The interconnection tier 130 may further include conductive patterns 134 extending through the ILD 132 to electrically couple to the circuit devices formed on the semiconductor substrate 100, for example to couple to the source/drain regions 112, 114, 122, 124 and to the gate structures 116, 128 of the transistors 110, 120. In some embodiments, one or more additional interconnection tiers 140 are formed over the semiconductor substrate 100, for example on the bottommost interconnection tier 130. In some embodiments, the additional interconnection tier(s) 140 of the interconnection structure IN include ILD(s) 142 and conductive patterns 144 (schematically represented by dots in FIG. 1 and FIG. 2) disposed on and extending through the corresponding ILD(s) 142. In some embodiments, the functional circuits formed by the interconnection structure IN may comprise logic circuits, memory circuits, sense amplifiers, controllers, input/output circuits, image sensor circuits, the like, or combinations thereof. The disclosure does not limit the number of additional interconnection tiers 140 formed in an interconnections structure IN, which may be adapted according to routing and design requirements.

In some embodiments, the ILDs (e.g., 132, 142) of the interconnection structure IN may include low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. In some embodiments, the ILDs (e.g., 132, 142) may be fabricated to a suitable thickness by flowable CVD (FCVD), CVD, HDPCVD, SACVD, spin-on, sputtering, or other suitable methods. In some embodiments, the ILD of an interconnection tier (e.g., the ILD 132 of the interconnection tier 130) may be formed during multiple steps and be constituted by two or more layers which may include the same or different dielectric materials. In some embodiments, the conductive patterns (e.g., 134, 144) may include aluminum, titanium, copper, nickel, tungsten, and/or alloys thereof, and may be fabricated through a sequence of deposition (e.g., CVD, plating, or other suitable processes) and planarization steps (e.g., chemical mechanical polishing). In some embodiments, the interconnection tiers (e.g., 130, 140) of the interconnection structure IN may be formed via damascene, dual damascene, or other suitable processes. The position (in terms of level height with respect to the semiconductor substrate 100) of the boundaries between the ILDs (e.g., 132, 142) may depend on the process followed for the formation of the interconnection structure IN. For the sake of simplicity and clarity, in FIG. 1 and FIG. 2 the ILDs are illustrated as a single, continuous layer.

In some embodiments, the interconnection structure IN further includes one or more memory tiers 150. For example, a memory tier 150 may be formed on the additional interconnection tier(s) 140. The memory tier 150 may include one or more memory cells MC10. For example, the memory tier 150 includes an array of memory cells MC10 disposed in between conductive lines 160, 210. The conductive lines 160, 210 contacts opposite terminals of the memory cells MC10. A memory cell MC10 includes a switch structure S10 acting as a selector and a memory element M10 connected in series. In some embodiments, the switch structure S10 may include a bottom electrode 172, a switch layer 174, and a middle electrode 190, where the switch layer 174 is disposed in between the bottom electrode 172 and the middle electrode 190. For example, the bottom electrode 172, the switch layer 174 and the middle electrode 190 may be vertically stacked on each other. The middle electrode 190 may be shared with the memory element M10, which may further include a memory layer 182 and a top electrode 184. The memory layer 182 and the top electrode 184 may be vertically stacked on the middle electrode 190. The electrodes 172, 184, 190 may include a different material than the conductive lines 160, 210. For example, the conductive lines 160, 210 may include copper, and the electrodes 172, 184, 190 may include tungsten. However, the disclosure is not limited thereto, and other combinations of materials are possible and contemplated within the scope of the disclosure.

The conductive lines 160, 210 may be used to address individual memory cells MC10. For example, the conductive lines 160 are traces extending substantially parallel to each other along a first direction (e.g., the Y direction), and distributed at a distance from each other along a second direction (e.g., the X direction) perpendicular to the first direction. The memory cells MC10 may be disposed on the conductive lines 160, with the bottom electrodes 172 contacting the conductive lines 160. Multiple memory cells MC10 may be disposed on a same conductive line 160. Similarly, the conductive lines 210 are traces extending substantially parallel to each other along the second direction (e.g., the X direction) and disposed at a distance from each other along the first direction (e.g., the Y direction). The conductive lines 210 may be disposed on the top electrodes 184, and a single conductive line 210 may contact multiple memory cells MC10. Memory cells MC10 disposed on a same conductive line 160 are contacted by different conductive lines 210, so that a combination of a conductive line 160 and a conductive line 210 allows to address a single memory cell MC10. When viewed from the top, the conductive lines 160, 210 form a reticulate with the memory cells MC10 disposed at the intersection points of the extending directions of the conductive lines 160 and 210, which may be considered to form rows and columns of the reticulate. In some embodiments, the conductive lines 160, 210 may sometimes be referred to as row patterns and column patterns.

One or more additional interconnection tiers 220 may be formed on the memory tier 150, including ILD(s) 222 and conductive patterns 224 (schematically represented as dots in FIG. 1 and FIG. 2). A passivation layer 230 may be disposed on the interconnection structure IN, including openings 232 exposing at their bottom portions of the uppermost conductive patterns 226. Contact pads 240 may be disposed in the openings of the passivation layer 230, contacting the uppermost conductive patterns 226. The contact pads 240 are connected to the memory cells MC10 and to the circuit devices formed on the semiconductor substrate 100 through the interconnection structure IN, and are provided to integrate the semiconductor device SD10 with other components of larger electronic devices.

It should be noted that while the above description presented the semiconductor device SD10 as including one memory tier 150 with memory cells MC10 having integrated switches S10 and memory elements M10, the disclosure is not limited thereto. For example, in some embodiments, multiple memory tiers such as the memory tier 150 may be stacked on each other. In some embodiments, the conductive lines (e.g., 210) of a bottom memory tier may be shared with the upper memory tier so that the memory cells of the upper memory tier are disposed directly on the conductive lines shared with the bottom memory tier. In some alternative embodiments, the switches S10 and the associated memory elements M10 may be formed independently, for example at different metallization levels of the semiconductor device SD10, without sharing the middle electrode. In other words, the disclosure does not limit the configuration (e.g., cross point, single layer, dual layer, etc.) of the array of memory cells MC10 included in the semiconductor device SD10.

In the following, some aspects of the memory cells MC10 according to some embodiments of the disclosure will be discussed. In some embodiments, the memory element M10 of a memory cell MC10 may include a material in the memory layer 182 which is switchable between two different detectable states. The memory element M10 may store a digital value (e.g., 0 or 1) according to the state of the material of the memory layer 182. The memory element M10 is not particularly limited, and may be, for example, a phase change memory element, a memory switch (such as the ones used for RRAMs, CBRAMs, FeRAMs, MRAMs), or the like. For example, for phase change memories, the material of the memory layer 182 may be a phase change material, such as a chalcogenide alloy which may be electrically switched between different physical states. The physical states may be different phases of the memory material, such as a crystalline phase, an amorphous phase, or two partially crystalline phases which exhibit different resistive behavior. In the case of ferroelectric memories, the memory material may include a ferroelectric material which may exist in different polarization states. By detecting the resistance/polarization or any other suitable property differing for the states of interest of the memory material, it is possible to determine the value stored by the memory element M10. Furthermore, by switching state (e.g., phase/polarization) of the memory material (for example, by applying a voltage characteristic of the material), it is possible to write a digital value in the memory element M10. The physical state (e.g., phase or polarization) of the memory material may be maintained after the write and/or read operation, so that the memory element M10 may be non-volatile.

In some embodiments, the switch S10 acting as selector is an ovonic threshold switch, which switches between an ON and an OFF state according to an applied voltage or current. For example, once a threshold voltage is applied or a threshold current runs through the ovonic threshold switch, the ovonic threshold switch is turned ON, and exists in a conductive state. When the voltage or current fall below the threshold value, the ovonic threshold switch is turned OFF. In some embodiments, inclusion of switches S10 help to reduce or prevent parasitic current paths within the array of memory cells MC10, reducing the possibility that non-selected memory cells MC10 may be addressed in place of the intended ones. In some embodiments, the behavior of the switch S10 is chiefly determined by the nature of the material used for the switch layer 174.

Figure 3:
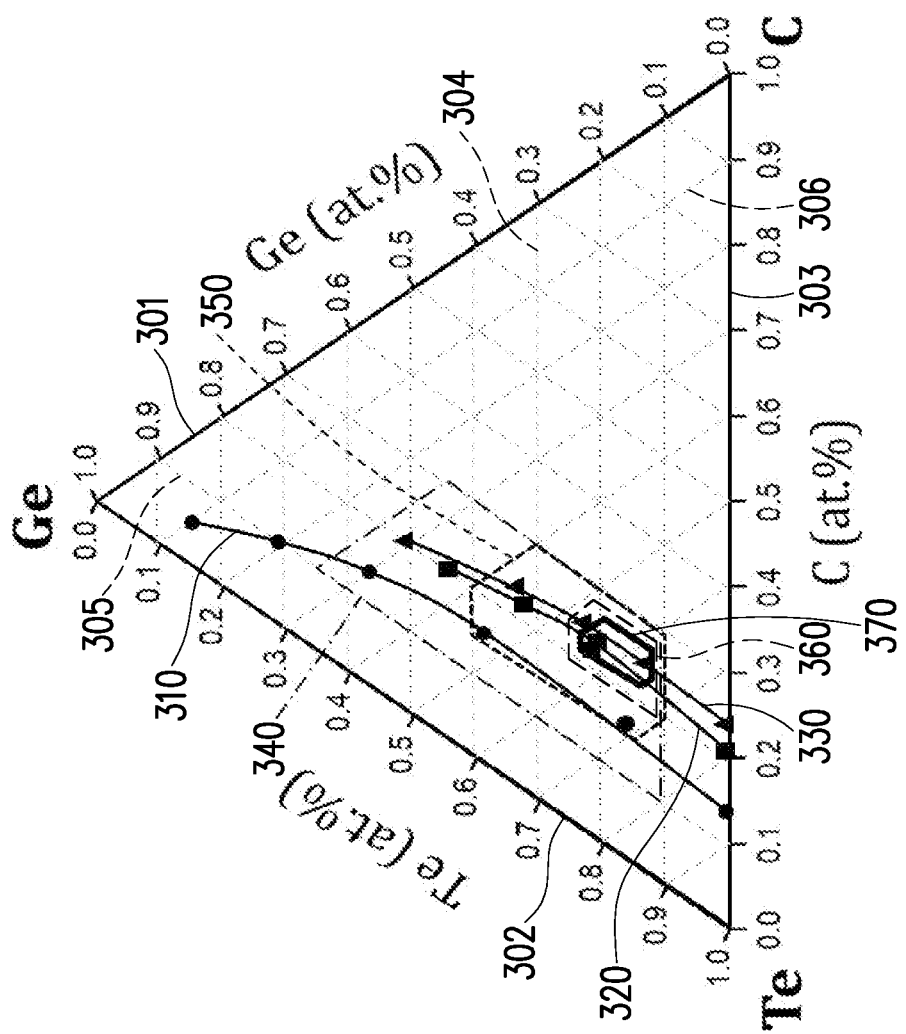
FIG. 3 is a ternary composition diagram of materials according to some embodiments of the disclosure.

In some embodiments, a material for the switch layer 174 is a ternary GeCTe material comprising carbon, germanium and tellurium, whose composition may be schematically represented in a composition diagram such as the one of FIG. 3. In the diagram of FIG. 3, points falling on the axis 301 correspond to binary mixtures of germanium and carbon. The labels of the axis 301 indicate the amount of germanium in the binary mixtures expressed in atomic percent. Points falling on the axis 302 correspond to binary mixtures of germanium and tellurium. The labels of the axis 302 indicate the amount of tellurium in the binary mixtures expressed in atomic percent. Points falling on the axis 303 correspond to binary mixtures of tellurium and carbon. The labels of the axis 303 indicate the amount of carbon in the binary mixtures expressed in atomic percent. Points not lying on any one of the axes 301, 302, 303 correspond to ternary materials. The compositions of the materials represented by off-axis points may be read by following the horizontal lines 304 to determine the amount (atomic percent) of germanium on the axis 301, following the oblique lines 305 joining the carbon axis 303 and germanium axis 301 to determine the amount (atomic percent) of carbon on the axis 303, and following the oblique lines 306 joining the tellurium axis 302 and the carbon axis 303 to determine the amount (atomic percent) of tellurium on the axis 302.

Figure 5B:
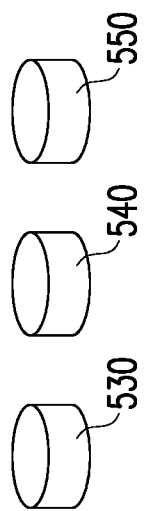
FIG. 5A and FIG. 5B are schematic views of targets employed during a manufacturing method of a material according to some embodiments of the disclosure.
Figure 5A:
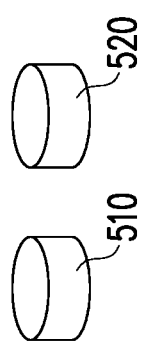
Figure 4:
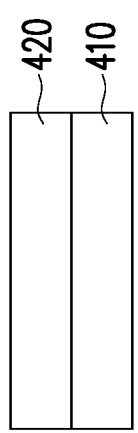
FIG. 4 is a schematic view of a structure produced during a manufacturing method of a material according to some embodiments of the disclosure.

In some embodiments, a layer 420 of a ternary GeCTe material according to the disclosure may be prepared on a substrate 410, as illustrated, e.g., in FIG. 4. The substrate 410 may be any structure and include any material on which the layer 420 of the ternary GeCTe material is to be formed. For example, in the case of the semiconductor device SD10 of FIG. 1, the substrate 410 may be the bottom electrode 172, however the disclosure is not limited thereto. In some alternative embodiments, the bottom electrode 172 may be omitted, and the substrate 410 may be one of the conductive lines 160 or a portion of ILD (e.g., of the ILD 200 of FIG. 2). In some yet alternative embodiments, the stacking order of the switch S10 and the memory element M10 may be inverted, and the substrate 410 may be the middle electrode 190. In some embodiments, the layer 420 is formed on the substrate 410 according to any suitable technique. For example, the layer 420 may be formed by sputtering, evaporation, atomic layer deposition, chemical vapor deposition or the like. In some embodiments, the ternary GeCTe material of the layer 420 is formed by co-sputtering from multiple targets or single sputtering from one alloy target. The composition of the ternary GeCTe material may then be adjusted by regulating the power applied to the target(s), the substrate temperature (e.g., in the range from about 25° C. to about 50° C.), sputtering pressure (e.g., in the range from about 0.3 mTorr to about 3 mTorr), and so on. For example, the ternary GeCTe material may be formed by co-sputtering of two targets 510, 520 illustrated in FIG. 5A. In some embodiments, when two targets 510, 520 are employed, at least one of the targets (e.g., the target 510) may include a binary or ternary combination of germanium, carbon and tellurium, and the other target (e.g., the target 520) may include elemental germanium, carbon, or tellurium, or another mixture of germanium, carbon and tellurium. For example, the target 510 may be a CTe target having a certain composition of carbon and tellurium, such as $C_{40}Te$, and the target 520 may be a Ge target. In some alternative embodiments, the ternary GeCTe material may be prepared by co-sputtering of three targets 530, 540, 550, illustrated, e.g., in FIG. 5B. For example, the three targets 530, 540, 550 may each include a different element (C, Ge, Te) of the ternary GeCTe material, or different compounds or alloys of the three constituting elements. In some embodiments, a different number of targets may be used (e.g., more or fewer than two or three), and the sputtering conditions may be adjusted accordingly. In some embodiments, high GeCTe purity (e.g., >99.9 at. %) may be achieved by controlling the base pressure before sputtering to be sufficiently low, e.g., below $1e^{-6}$ Torr. By doing so, in some embodiments residual gas inclusion like moisture and oxygen may be reduced or avoided.

In some embodiments, several materials (represented as dots, squares, or triangles in FIG. 3) were prepared and tested as materials for the switch S10. The materials were prepared by co-sputtering from one to three targets including elemental carbon, elemental tellurium, and a CTe (e.g., $C_{40}Te$) target. Powers in the range from 300 to 900 W were applied in RF sputtering of the CTe target, powers in the range from 15 to 100 W were applied in DC sputtering of the germanium target, and powers in the range from 0 to 40 W were applied in RF sputtering to the tellurium target. The compositions of the materials reported in Table 1 were measured by X-ray Photoelectron Spectroscopy (XPS). XPS analysis was performed with monochromatic Al K-alpha X-ray (1486.6 eV), 1 kv Ar+ sputter (ThermoFisher, Theta Probe XPS, UK) in UHV (1e-9 mbar). The film thickness and optical band gap (Eg) were measured by spectroscopic ellipsometer (M2000, J. A. Woollam Co.) in a wavelength range from about 193 to about 1690 nm. The film thickness ranged from about 250 angstroms to about 400 angstroms. The optical band gaps (Eg) ranged from about 0.35 eV to about 0.85 eV.

TABLE 1

Compositions of some materials tested

| | Composition (at. %) |
|---|---|
| Example 1 | C: 14.25; Te: 85.75; O: <0.1 |
| Example 2 | Ge: 38.4; C: 15.6; Te: 46; O: <0.5 |
| Example 3 | Ge: 55.8; C: 13.5; Te: 29.6; O: <0.5 |
| Example 4 | Ge: 70.5; C: 10; Te: 18.9; O: <0.5 |
| Example 5 | Ge: 83.1; C: 5.4; Te: 9.9; O: <0.5 |
| Example 6 | C: 21; Te: 79; O: <0.1 |
| Example 7 | Ge: 20.8; C: 23.3; Te: 55.9; O: <0.5 |
| Example 8 | Ge: 32.2; C: 22.1; Te: 45.7; O: <0.5 |
| Example 9 | Ge: 43.8; C: 20.4; Te: 35.8; O: <0.5 |
| Example 10 | Ge: 15.8; C: 16.1; Te: 68.1; O: <0.5 |
| Example 11 | Ge: 25.4; C: 16.9; Te: 57.2; O: 0.5 |
| Example 12 | C: 23.9; Te: 76.1; O: <0.1 |
| Example 13 | Ge: 12.8; C: 24.7; Te: 62.0; O: 0.5 |
| Example 14 | Ge: 22.9; C: 24.5; Te: 52.6; O: <0.5 |
| Example 15 | Ge: 33.2; C: 23.4; Te: 43.4; O: <0.5 |
| Example 16 | Ge: 50.5; C: 20.3; Te: 29.2; O: <0.5 |

The properties of the materials were tested by including the materials in switches of testing devices having a structure substantially similar to the one illustrated in FIG. 23B. In the testing devices, only the switches S10 were evaluated.

Generally speaking, the carbon content was observed to be roughly constant at fixed power applied to the CTe target, regardless of Ge power. The carbon content was observed to increase with increasing power applied to the CTe target. Increasing power applied to the germanium target was observed to causes increasing of the germanium content and decreasing of the tellurium content. The compositions of the tested samples fell substantially along the three lines 310, 320, 330 illustrated in FIG. 3, roughly corresponding to a carbon content of about 14, 20 or 24 atomic percent, respectively. In some embodiments, up to 0.5 atom percent of oxygen could be found in the prepared materials. Without being bound to or limited by any theory or model, it is possible the observed oxygen may come from gas adsorbed on the surface of the base substrate (e.g., Si substrate). In such cases, the oxygen impurity may be controller, reduced, or even eliminated from the produced materials by cleaning and/or degassing the substrate surface, with or without a pre-clean process. In some embodiments, other impurities may come from the sputter target(s). In some embodiments, higher purity may improve device performance, such as lowering the leakage current.

Figures 6A, 6B:
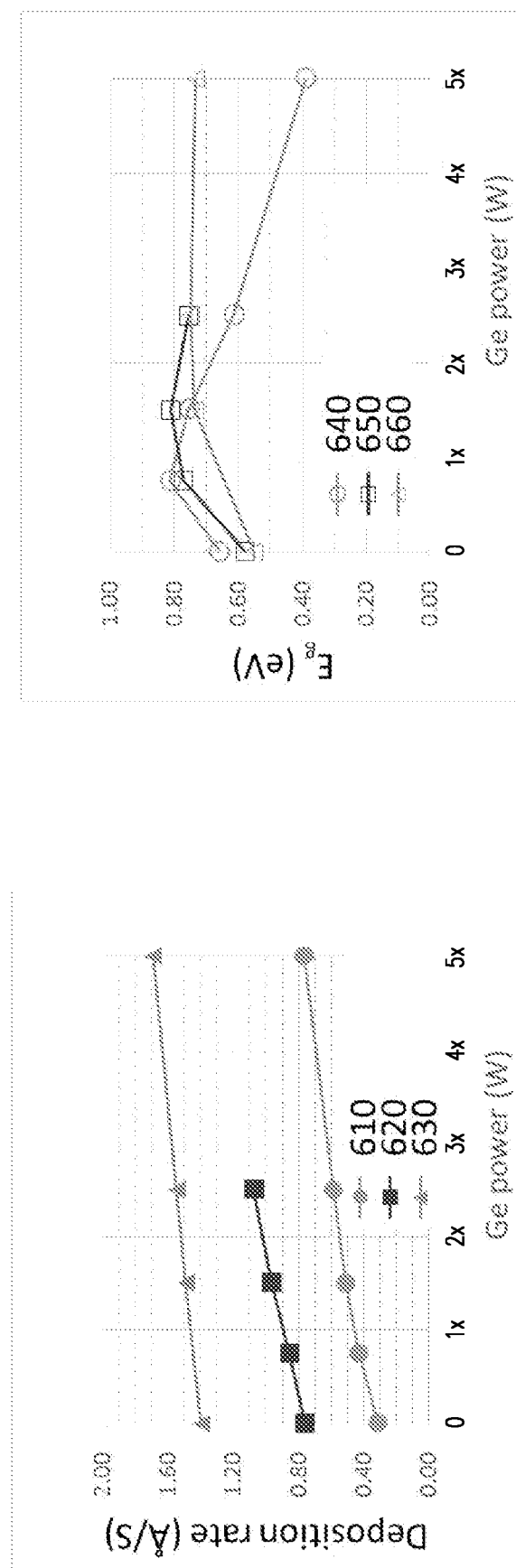

In FIG. 6A are plotted the observed deposition rates (in terms of thickness of the formed layer over time) of some of the materials prepared according to Table 1 above. Each one of the trend lines 610, 620, 630 plotted in FIG. 6A corresponds to a series of materials prepared with a same power applied to the CTe target (namely P1, P2 and P3 for the lines 610, 620, 630, respectively, with P2 being greater than P1 and P3 being greater than P2) and with increasing power applied to the Ge target (which corresponds to the abscissa axis in FIG. 6A). As illustrated by the data plotted in FIG. 6A, the deposition rate increases monolithically with the applied powers to the Ge and CTe targets.

In FIG. 6B are plotted the optical band gaps $E_g$ for the some of the tested materials. As in FIG. 6A, also in FIG. 6B the data are organized by series according to the power applied to the CTe target, with the lines 640, 650, and 660 corresponding to applied powers P1 to P3, respectively. The abscissa axis refers to the power applied to the Ge target. In the context of the Poole-Frank model, the electrical band gap energy can be approximated by the optical bandgap which may be inversely proportional to the logarithm of the OFF-current of the ovonic threshold switch. That is, for materials having large optical bandgap, lower leakage currents are expected to be measured when the switch is in the OFF state. As evidenced by the data plotted in FIG. 6B, materials including a certain amount of germanium together with carbon have larger optical bandgaps than binary mixtures of carbon and tellurium. In some embodiments, by including germanium together with carbon and tellurium in a material for an ovonic threshold switch, larger optical bandgaps may be observed than in the absence of germanium, so that lower leakage currents may be expected. As illustrated by the data in FIG. 6B, the optical bandgap does not monotonically increase with the power applied to the germanium target. In some embodiments, a certain balance between the content of germanium and carbon may be reached to tune the optical bandgap. For example, in some embodiments, the germanium content may be from about 10 atomic percent to about 65 atomic percent. In some embodiments, the carbon content may be from about 10 atomic percent to about 30 atomic percent. In some embodiments, the content of both germanium and carbon is in the above two ranges. For example, the germanium content is from about 10 atomic percent to about 65 atomic percent, the carbon content is from about 10 atomic percent to about 30 atomic percent and the balance of the content is tellurium, for example with a content being in the range from 25 atomic percent to about 80 atomic percent. Manufacturing impurities (such as oxygen) may be included up to a content (e.g., 0.5 atoms percent) not significantly affecting the properties (e.g., the optical bandgap) of the material. In some embodiments, the composition of the ternary GeCTe material may fall within the area 340 illustrated in the composition diagram of FIG. 3. In some embodiments, material falling within the area 340 of FIG. 3 may have acceptable properties to be used as selector materials.

Figure 7B:
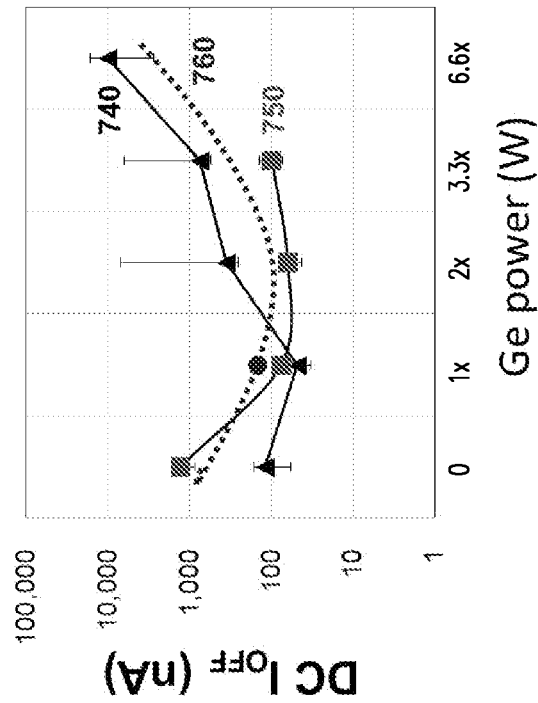
Figure 7A:
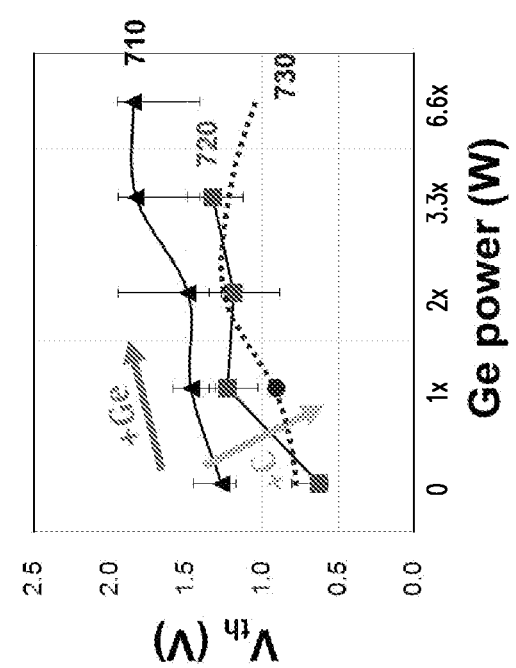

In FIG. 7A are plotted measured values of the threshold voltage $V_{th}$ for the switching behavior of some of the materials prepared. As done in the previous plots, the data have been grouped in series (the lines 710, 720, 730) according to the power applied to the CTe target (P1, P2, P3, respectively). In some embodiments, by adopting materials having threshold voltages $V_{th}$ in a suitable range, the power consumption of the corresponding semiconductor devices may be reduced without significantly affecting the ON/OFF operation window of the selector material in the memory array. From the measured materials, it appears that the threshold voltage $V_{th}$ increases with increasing germanium content, and decreases with increasing carbon content. For example, materials with carbon content equal to or greater than 15 atomic percent may show threshold voltages $V_{th}$ lower than about 1.5 V.

In FIG. 7B are plotted measured values of leakage current $I_{OFF}$ for some of the materials prepared. The leakage currents $I_{OFF}$ were measured by applying a voltage corresponding to half the value of the measured threshold voltage $V_{th}$ for the corresponding material before turn on switch. In FIG. 7B, the data have been grouped in series (the lines 740, 750, 760) according to the power applied to the CTe target (P1, P2, P3, respectively). The ordinate axis is logarithmic. In some embodiments, adopting materials having lower leakage currents $I_{OFF}$ may save the power and increase the reliability of the switch. When the switch is used as a selector, lower leakage currents $I_{OFF}$ reduce the possibility that unselected memory elements may be accessed together or in place of the intended ones. In some embodiments, the observed leakage currents $I_{OFF}$ increase at low and high values for the content of carbon and germanium. So, for example, inclusion of some germanium may reduce the leakage current $I_{OFF}$ observed with respect to binary mixtures of carbon and tellurium, while the leakage current $I_{OFF}$ may increase for materials richer in germanium. In some embodiments, a certain balance between the content of germanium and carbon may be reached to tune the leakage current $I_{OFF}$. For example, in some embodiments, the germanium content may be from about 10 atomic percent to about 40 atomic percent. In some embodiments, the carbon content may be from about 15 atomic percent to about 30 atomic percent. In some embodiments, the content of both germanium and carbon is in the above two ranges. For example, the germanium content is from about 10 atomic percent to about 40 atomic percent, the carbon content is from about 15 atomic percent to about 30 atomic percent and the balance is tellurium, for example with a content being in the range from 40 atomic percent to about 70 atomic percent. Manufacturing impurities (such as oxygen) may be included up to a content (e.g., 0.5 atoms percent) not significantly affecting the properties (e.g., the threshold voltage and/or the leakage current $I_{OFF}$) of the ternary GeCTe material. In some embodiments, the composition of the ternary GeCTe material may fall within the area 350 illustrated in the composition diagram of FIG. 3.

Figure 7C:
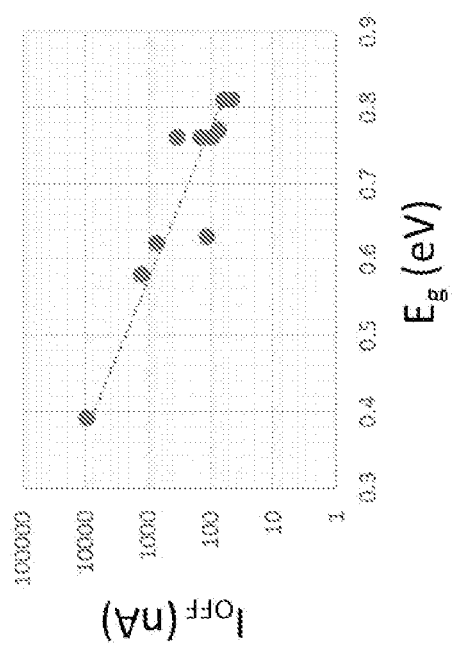
Figures 10A, 10B, 10C:
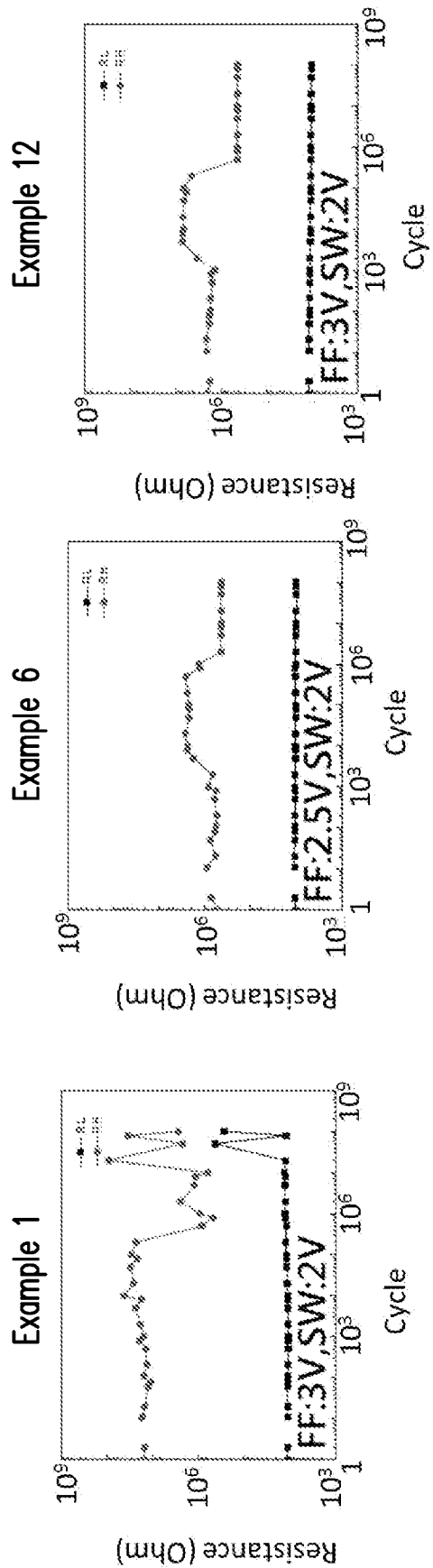
Figures 10D, 10E, 10F:
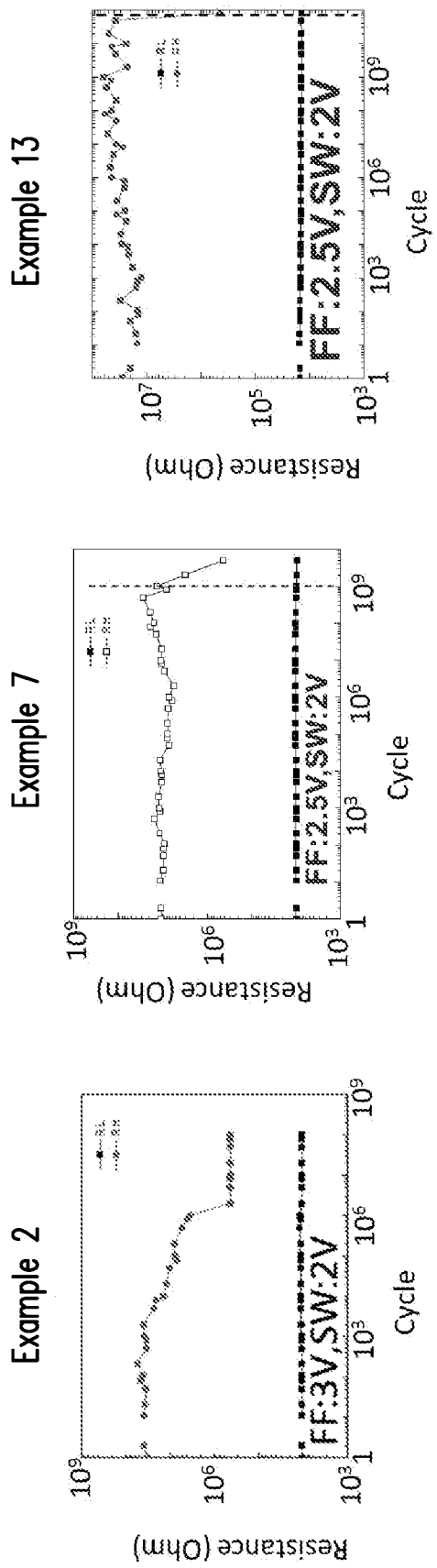
Figures 10G, 10H:
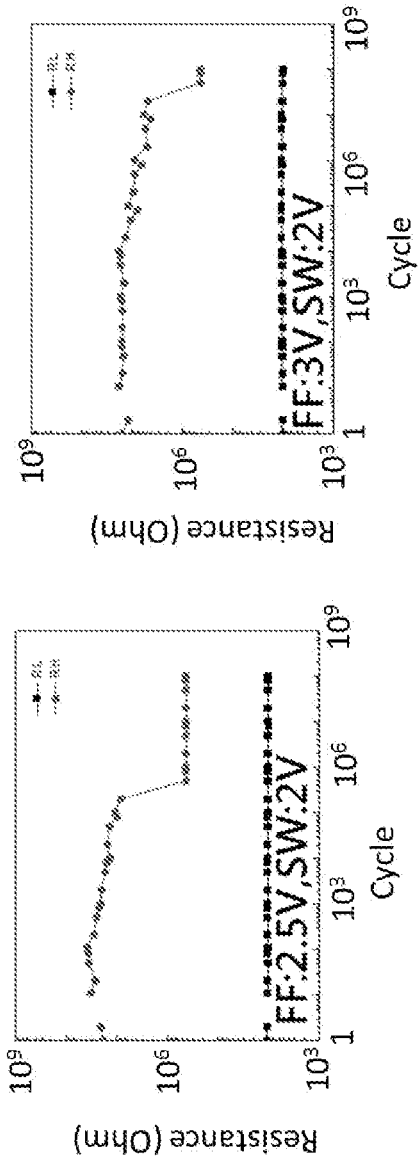
Figures 10I, 10J, 10K:
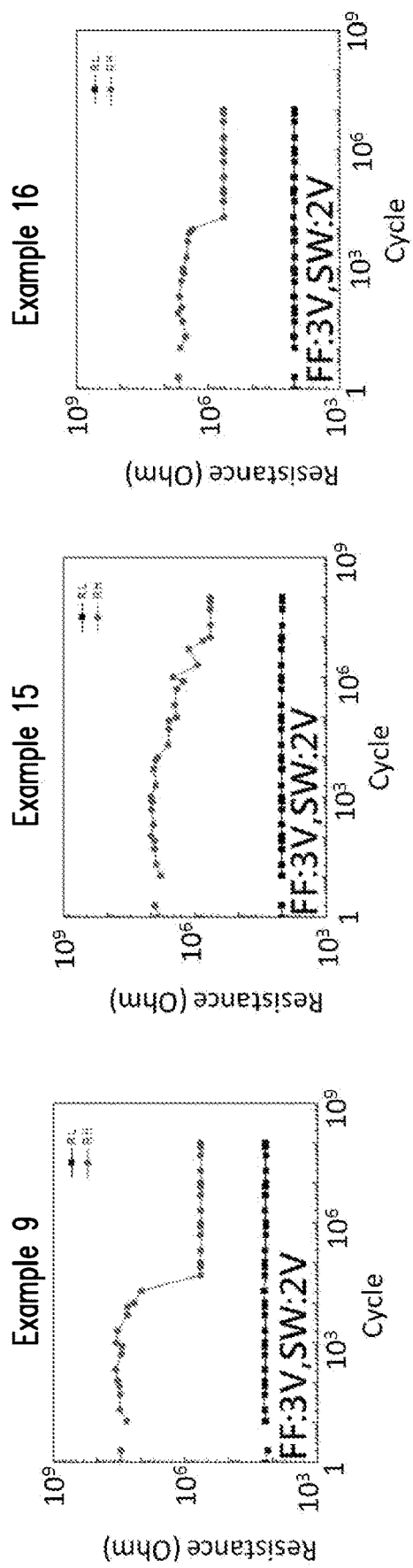

In FIG. 7C are plotted the observed values of leakage current $I_{OFF}$ as a function of the observed optical bandgaps $E_g$. The abscissa axis is linear, while the ordinate axis is logarithmic. From the plot of FIG. 7C, it appears that the leakage current $I_{OFF}$ and the optical bandgaps Eg are correlated according to the Poole-Frenkel model. That is, to larger optical bandgaps $E_g$ correspond lower leakage currents $I_{OFF}$.

In some embodiments, the ternary GeCTe material including germanium may have superior thermal resistance compared to binary materials including only carbon and tellurium. In FIG. 8A and FIG. 8B are plotted the observed voltages and currents, respectively, of ternary materials according to some embodiments of the disclosure. The materials correspond to the compositions of the examples indicated in Table 1, with a thickness of about 15 nm. In FIG. 8C are plotted observed current data for a binary $C_{14}Te_{86}$ material according to some embodiments of the disclosure. The left halves of the plots of FIG. 8A to FIG. 8C pertain to data measured on raw materials, before annealing. The right halves of the plots pertain to data measured on materials which were annealed at 250° C. for 40 minutes. On the abscissa axis in FIG. 8C are indicated the thicknesses of the measured films. As illustrated by the curves 810 and 820 of FIG. 8A and FIG. 8B, upon annealing neither the threshold voltage $V_{th}$ (curve 810) nor the leakage current $I_{OFF}$ (curve 820, measured at half of the threshold voltage $V_{th}$) change significantly for the ternary materials. On the contrary, an increase of about two order of magnitudes is observed in the leakage current $I_{OFF}$ for annealed films of binary materials, as indicated by the curve 830 of FIG. 8C. In FIG. 8A to FIG. 8C, the curves 815, 825, 835 represent the first-fire voltage (FIG. 8A) and the leakage current $I_{OFF}$ (FIG. 8B and FIG. 8C) in the first I-V loop. In some embodiments, the so-called "first-fire" is to break through some barrier to initialize the device. From the above, it appears possible that the ternary GeCTe materials have higher crystallization temperatures than the binary CTe materials, so that the switching behavior can be maintained following annealing steps.

In FIG. 9A and FIG. 9B are plotted repetitive current-voltage curves measured for the ternary material of Example 7 with a thickness of about 15 nm at different measurement modes. In FIG. 9C and FIG. 9D are plotted current-voltage curves measured for the binary material of Example 1 with a thickness of about 15 nm at different measurement modes. In FIG. 9A and FIG. 9C are plotted data measured on raw materials, without performing an annealing step. In FIG. 9B and FIG. 9D are plotted data measured on the materials of FIG. 9A and FIG. 9C, respectively, after annealing at 250° C. for 40 minutes. In some embodiments, the switching behavior of the ternary materials may survive the annealing step substantially unaltered, as evidenced by the similarity of the curves of FIG. 9A and FIG. 9B. By contrast, the switching behavior of binary materials may be entirely lost following the annealing step. From the data of FIG. 8A to FIG. 9D it can be seen how, in some embodiments, greater thermal stability may be achieved for the ternary GeCTe materials over binary CTe materials.

In FIG. 10A to FIG. 10K are plotted endurance curves of switches including the materials of some of the examples of Table 1. More specifically, the endurance curves show the measured resistance values in the ON and OFF states of ovonic threshold switches including the materials of some examples upon repeated switching between said ON and OFF states. In the drawings are also indicated the voltage of first-fire ("FF") and the voltage applied during operation ("SW"). The data of FIG. 10A to FIG. 10C pertain to binary CTe materials including about 14, 21 and 24 atomic percent of carbon. Such binary materials tend to endure up to $10^6$ cycles maximum before displaying unreliable, erratic behavior or significant changes in the resistance of one or both of the ON and OFF states. The ternary materials, on the other hand, display endurances at least comparable to the binary materials, reaching, for example, above $10^9$ or $10^{10}$ cycles in the case of the materials of examples 7 and 13 as plotted in FIG. 10E and FIG. 10F, respectively. In some embodiments, a certain balance between the content of germanium and carbon may be reached to tune the endurance of the ovonic threshold switches. For example, in some embodiments, the germanium content may be from about 10 atomic percent to about 22 atomic percent. In some embodiments, the carbon content may be from about 20 atomic percent to about 26 atomic percent. In some embodiments, the content of both germanium and carbon is in the above two ranges. For example, the germanium content is from about 10 atomic percent to about 22 atomic percent, the carbon content is from about 20 atomic percent to about 26 atomic percent and the balance is tellurium, for example with a content being in the range from 52 atomic percent to about 70 atomic percent. Manufacturing impurities (such as oxygen) may be included up to a content (e.g., 0.5 atom percent) not significantly affecting the properties (e.g., the endurance) of the ternary GeCTe materials. In some embodiments, the composition of the ternary GeCTe material may fall within the area 360 illustrated in the composition diagram of FIG. 3. In some other embodiments, the germanium content may be from about 12 atomic percent to about 21 atomic percent. In some embodiments, the carbon content may be from about 22 atomic percent to about 25 atomic percent. In some embodiments, the content of both germanium and carbon is in the above two ranges. For example, the germanium content is from about 12 atomic percent to about 21 atomic percent, the carbon content is from about 22 atomic percent to about 25 atomic percent and the balance is tellurium, for example with a content being in the range from 56 atomic percent to about 66 atomic percent. Manufacturing impurities (such as oxygen) may be included up to a content (e.g., 0.5 atom percent) not significantly affecting the properties (e.g., the endurance) of the ternary GeCTe materials. In some embodiments, the composition of the ternary GeCTe material may fall within the area 370 illustrated in the composition diagram of FIG. 3.

Figure 11:
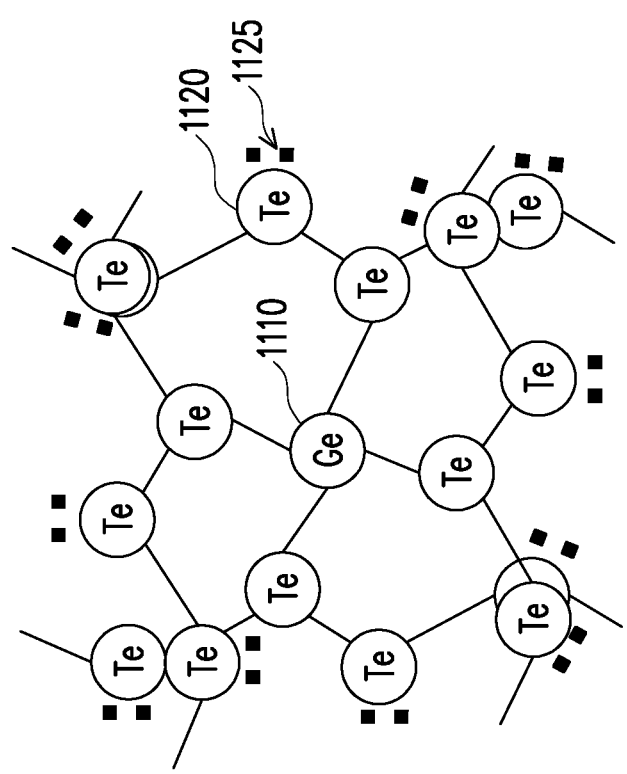
FIG. 11 is a schematic view of germanium-doped tellurium according to some embodiments of the disclosure.

Referring to FIG. 11, without being bound to nor limited by any theory, it is possible that by doping CTe with germanium, the germanium atoms 1110 form higher hybridization bonds (e.g., $sp^3$-p) with the tellurium atoms 1120, which reinforce the material structure by cross-linking chalcogen chains. This may, in turn, lead to higher thermal resistance. Furthermore, the germanium atoms 1110 may engage with lone pairs 1125 of electrons of the tellurium atoms 1120, increasing the trap depth of the material and lowering the trap density, thus also lowering the leakage current $I_{OFF}$.

Based on the above, a ternary GeCTe material according to the disclosure may perform better than binary CTe materials in terms of one or more of optical bandgap $E_g$, leakage current $I_{OFF}$, thermal stability (e.g., higher crystallization temperature) and/or endurance. In some embodiments, the observed thermal stability allows easy integration within non-volatile memories such as phase change memories, RRAM, or the like. In some embodiments, the ternary GeCTe material may be conveniently obtained by sputtering from one or more targets. In some embodiments, the GeCTe material does not include toxic materials (e.g., As or Pb), and may be considered a green, eco-friendly solution for device manufacturing.

As discussed above, according to some embodiments, the ternary GeCTe material may be particularly suitable to be included in ovonic threshold switches used as selectors in memory devices, however, the disclosure is not limited thereto, and other applications of the ternary GeCTe material are contemplated within the scope of the disclosure. For example, switches including the ternary GeCTe material may be integrated within larger functional circuits without necessarily acting as selectors.

In the following will be described semiconductor devices including a ternary GeCTe material and their manufacturing methods according to some embodiments of the disclosure. FIG. 12A to FIG. 18A are schematic cross-sectional views of structures formed during a manufacturing method of the semiconductor device SD10 of FIG. 1. More particularly, the structures illustrated in FIG. 12A to FIG. 18A pertains to the fabrication of the memory tier 150 of the semiconductor device SD10 according to some embodiments of the disclosure. Only a portion of a region where the memory tier 150 is formed is illustrated in FIG. 12A to FIG. 18A for the sake of clarity. FIG. 12B to FIG. 18B are schematic top views of the corresponding structures of FIG. 12A to FIG. 18A.

In FIG. 12A and FIG. 12B, the conductive lines 160 are illustrated as embedded within the ILD 142. The conductive lines 160 extend parallel to each other along a first direction (e.g., the Y direction) and are disposed at a distance from each other along a perpendicular direction (e.g., the X direction).

Figure 13A:
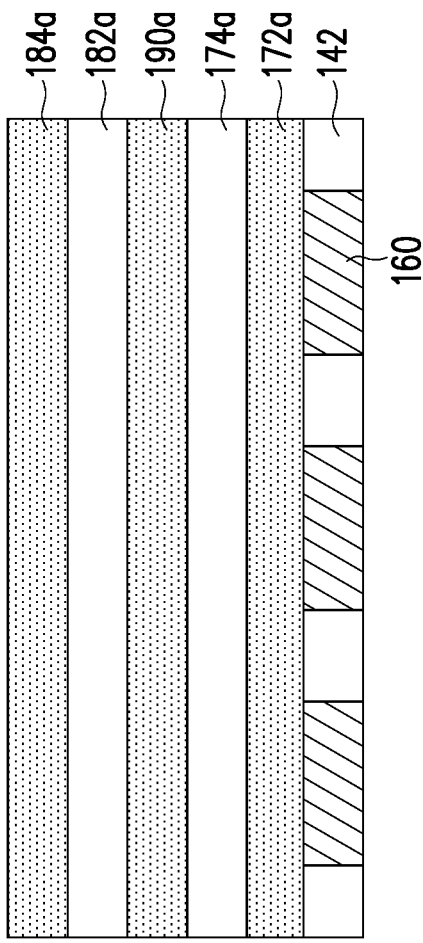
Figure 13B:
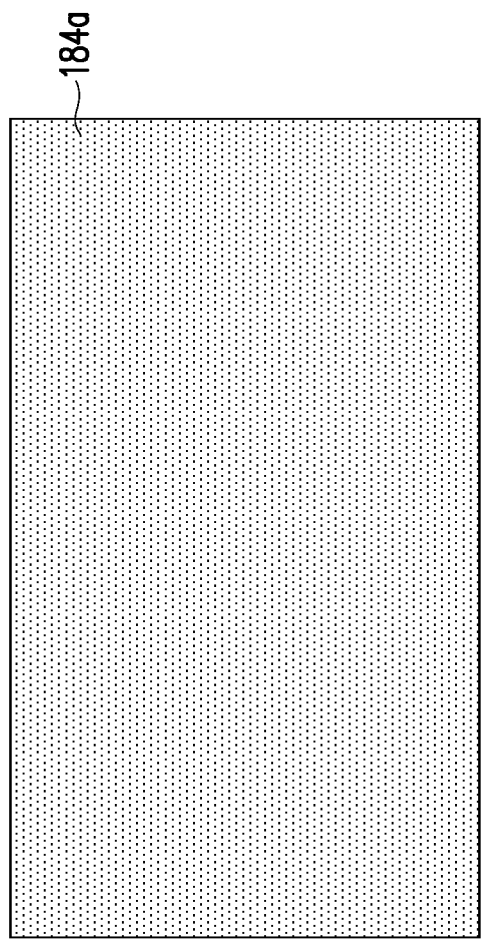

In FIG. 13A and FIG. 13B, a stack of layers is blanketly formed over the conductive lines 160 and the ILD 142. The stack of layers may include, in order from the conductive lines 160, a bottom electrode material layer 172a, a switch material layer 174a, a middle electrode material layer 190a, a memory material layer 182a and a top electrode material layer 184a. The electrode material layers 172a, 190a, 184a may include a conductive material, such as a metal. For example, the electrode material layers 172a, 190a, 184a may include tungsten. The electrode material layers 172a, 190a, 184a may be formed according to any suitable process. For example, the conductive material may be deposited via sputtering, plating, or other suitable techniques.

The switch material layer 174*a* includes any one of the ternary GeCTe materials previously described. In some embodiments, the composition of the ternary GeCTe material included in the switch material layer 174*a* falls within the area 340 of FIG. 3. In some embodiments, the composition of the ternary GeCTe material included in the switch material layer 174*a* falls within the area 350 of FIG. 3. In some embodiments, the composition of the ternary GeCTe material included in the switch material layer 174*a* falls within the area 360 of FIG. 3. In some embodiments, the composition of the ternary GeCTe material included in the switch material layer 174*a* falls within the area 370 of FIG. 3. In some embodiments, the ternary GeCTe material is formed by sputtering, evaporation, atomic layer deposition, chemical vapor deposition, or other suitable techniques.

The memory material layer 182*a* may include any suitable memory material, such as phase change material, ferroelectric materials, resistive oxide materials, or the like. In some embodiments, the memory material layer 182*a* may be a composite layer including different materials. The memory material layer 182*a* may be formed by any suitable deposition technique, such as sputtering, evaporation, atomic layer deposition, chemical vapor deposition or the like.

Figure 14A:
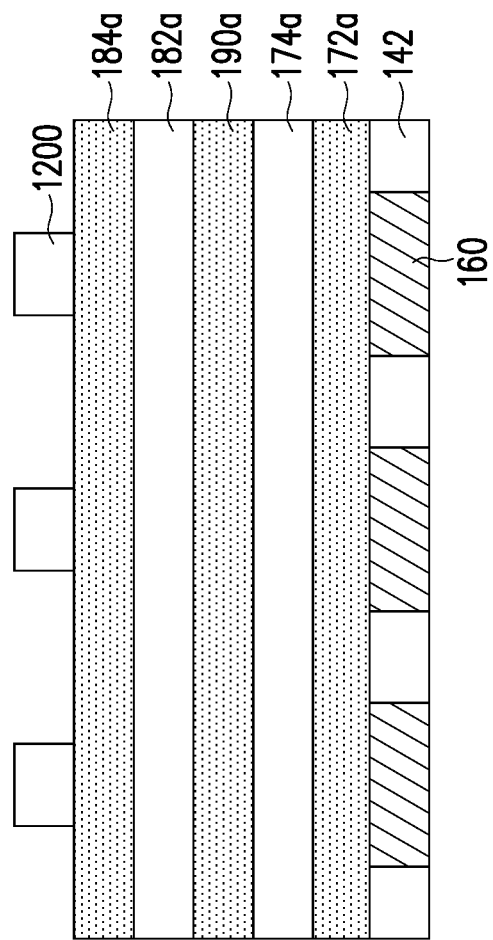
Figure 14B:
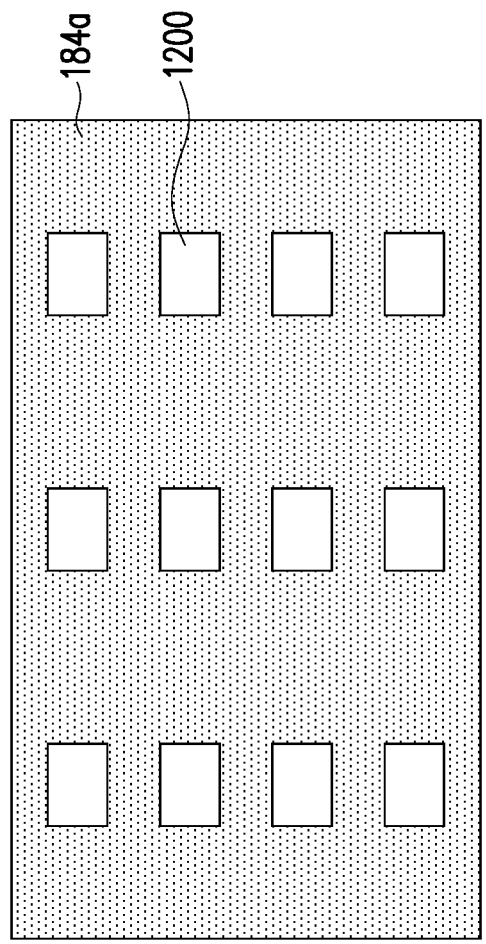

In FIG. 14A and FIG. 14B, an auxiliary mask 1200 is formed on the upper layer of the stack, for example, on the top electrode material layer 184*a*. The auxiliary mask 1200 may include a positive or a negative photoresist, as well as one or more inorganic materials such as oxides or nitrides, and may be formed, for example, through a sequence of deposition (e.g., spin on), exposure, and development steps. In some embodiments, the auxiliary mask 1200 is patterned in a plurality of separate blocks overlying the conductive lines 160. The blocks of the auxiliary mask 1200 may be isolated from each other, and disposed, for example, in an array manner, with columns of blocks overlying the conductive lines 160. That is, multiple blocks of the auxiliary mask 1200 may overlie a same conductive line 160.

The pattern of the auxiliary mask 1200 is transferred to the underlying stacked layers, to form an array of memory cells MC10 having a pillar shape, as illustrated, e.g., in FIG. 15A and FIG. 15B. The layers may be patterned for example via one or more etching steps. The etching may be any acceptable etch process, such as wet or dry etching, a reactive ion etch (RIE), neutral beam etch (NBE), ion beam etch (IBE), the like, or a combination thereof. The etching may be anisotropic. Following etching, memory cells MC10 including switches S10 and memory elements M10 connected in series are formed. The electrodes 172, 190, 184, the switch layer 174 and the memory layer 182 of the memory cells MC10 are formed from the electrode material layers 172*a*, 190*a*, 184*a*, the switch material layer 174*a* and the memory material layer 182*a*, respectively. In some embodiments, the footprints of the electrodes 172, 190, 184, the memory layers 182, and the switch layers 174 within a memory cell MC10 may match in size with each other, and be vertically aligned with respect to each other. After formation of the memory cells MC10, the auxiliary mask 1200 may be removed, for example via selective etching, to expose the top electrodes 184.

In FIG. 16A and FIG. 16B, an ILD 200*a* is formed on the ILD 142 and the conductive lines 160 to bury the memory cells MC10. The ILD 200*a* may fill the space in between adjacent memory cells MC10 and may further cover top surfaces of the memory cells MC10. A planarization process may be performed to reduce the thickness of the ILD 200*a* so that the top electrodes 184 of the memory cells MC10 are exposed at the level height of the top surface 200*t* of the ILD 200, as illustrated, e.g., in FIG. 17A and FIG. 17B. In some alternative embodiments, trenches may be formed at the top surface of the encapsulant 200*a*. The trenches may extend parallel to each other and perpendicular with respect to the conductive lines 160. The top electrodes 184 of the memory cells MC10 may be exposed at the bottom of the trenches, with a same trench exposing top electrodes 184 formed on different conductive lines 160.

In FIG. 18A and FIG. 18B, the conductive lines 210 are formed on the memory cells MC10 and the ILD 200, to contact the top electrodes 184 exposed by the ILD 200. The conductive lines 210 extend perpendicularly with respect to the conductive lines 160, and contact memory cells MC10 disposed on different conductive lines 210. The conductive lines 210 may be formed by patterning a conductive material disposed on the planarized ILD 200, or may be formed by filling with conductive material trenches (not shown) formed in the ILD 200*a* (illustrated, e.g., in FIG. 16A), for example.

In the memory cells MC10 the memory element M10 is stacked on the switch S10, however the disclosure is not limited thereto. In some embodiments, the memory element M10 may be disposed at the smaller electrode contact side, for example when a phase change material is used for the memory layer 182. In some embodiments, in the pillar configuration of FIG. 18A and FIG. 18B, top part of the pillar closer to the conductive lines 210 may be narrower than the bottom part closer to the conductive lines 160. In some alternative embodiments, the dimensions at the top and bottom of the pillars may be comparable, and the switch S10 and the memory element M10 may be stacked in either order independently of the material used for the memory element M10.

Figure 19E:
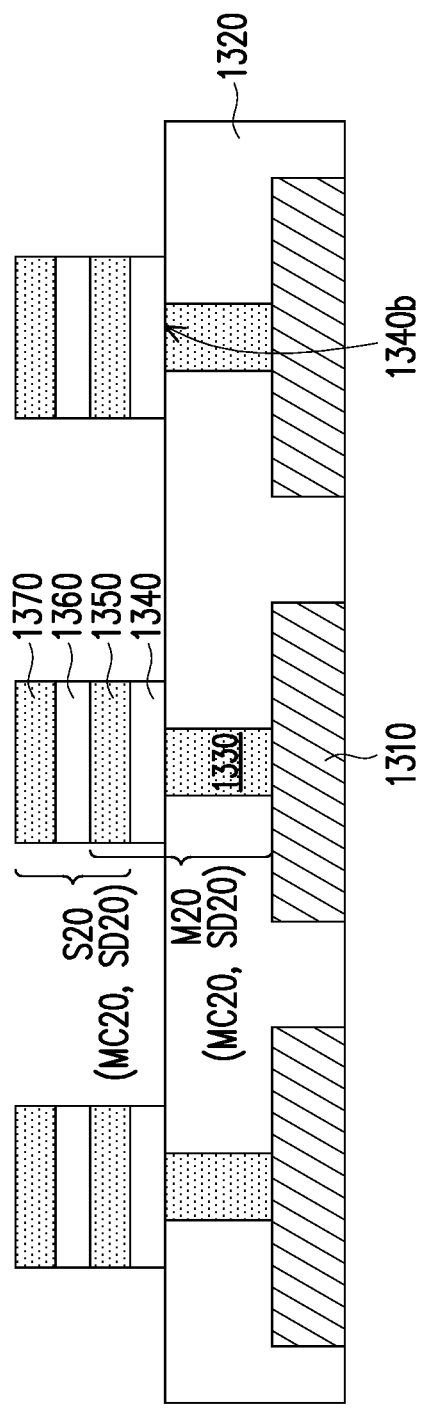

Furthermore, the disclosure does not limit the configuration of the memory cells. For example, FIG. 19A to FIG. 19G illustrate structures formed during a manufacturing method of a semiconductor device SD20 including memory cells MC20 having a mushroom configuration. In FIG. 19A, the conductive lines 1310 may have the same configuration as the conductive lines 160, extending parallel to each other along a first direction and distributed at a distance from each other along a second direction perpendicular to the first direction. The conductive lines 1310 may be embedded in the ILD 1320, which may be sufficiently thick to bury the conductive lines 1310. An array of plug openings 1322 is formed in the ILD 1320 exposing the conductive lines 1310 at their bottom. The plug openings 1322 are formed in the desired place for the later formed memory cells. Multiple plug openings 1322 separated from each other may expose the same conductive line 1310 at their bottom.

In FIG. 19B, a conductive electrode material 1330*a* is formed on the ILD 1320, filling the plug openings 1322 and further covering the top surface 1320*t* of the ILD 1320. The conductive electrode material 1330*a* formed on the top surface 1320*t* of the ILD 1320 may then be removed, for example during a planarization process such as CMP, to leave bottom electrodes 1330 formed as plugs within the plug openings 1332, as illustrated, e.g., in FIG. 19C.

In FIG. 19D, a layer stack including a memory material layer 1340*a*, a middle electrode material layer 1350*a*, a switch material layer 1360*a* and a top electrode material layer 1370*a* is then formed on the ILD 1320 and the bottom electrodes 1330, employing similar material and processes as previously described with reference to FIG. 14A.

In FIG. 19E, the layer stack is patterned to form an array of memory cells MC20 in correspondence of the bottom electrodes 1330. The memory cells MC20 include memory elements M20 and switches S20. The switches S20 are ovonic threshold switches including a ternary GeCTe material according to the disclosure. The memory layer 1340, the middle electrode 1350, the selector layer 1360, and the top electrode 1370 have a footprint larger than the bottom electrode 1330. The bottom electrode 1330 may contact a portion of the bottom surface 1340b of the overlying memory layer 1340, while the remaining part of the bottom surface 1340b extends on the ILD 1320. The memory layer 1340 and the switches S20 have substantially the same horizontal footprint, and laterally protrude with respect to the underlying bottom electrode 1330. That is, the memory cells MC20 have a mushroom configuration.

Figure 19F:
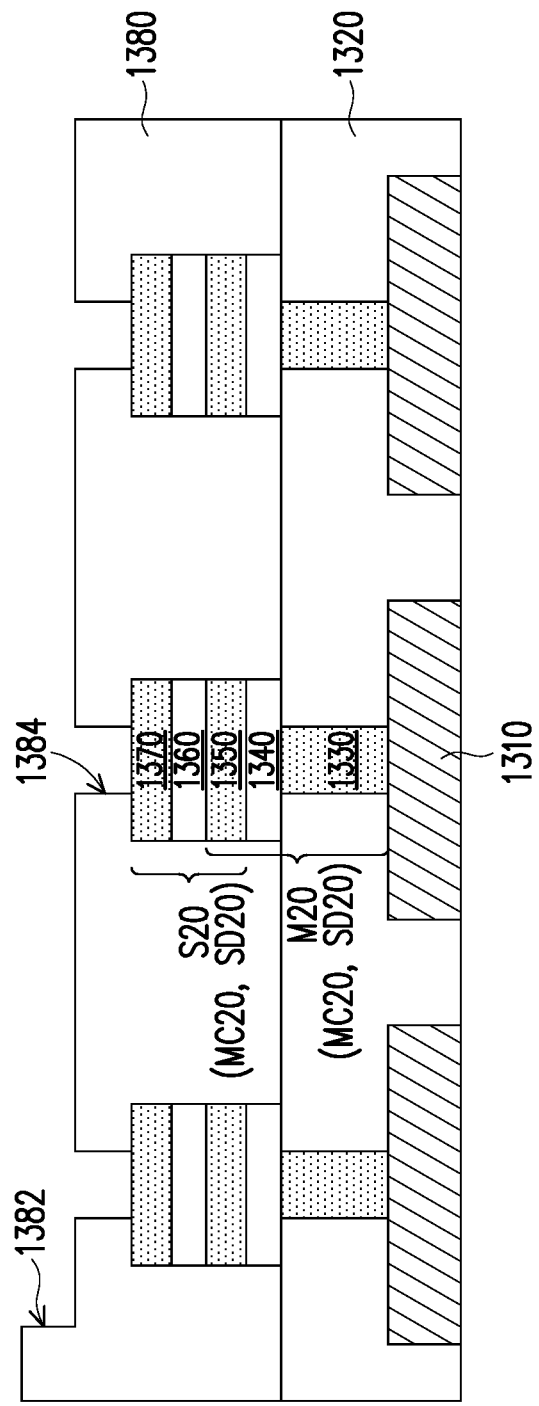

In FIG. 19F, an ILD 1380 is formed on the ILD 1320, initially burying the memory cells MC20. In some embodiments, trenches 1382 are formed extending parallel to each other and perpendicular to the conductive lines 1310. From the bottom of the trenches 1382, via openings 1384 may extend to expose at least a portion of a top surface of a top electrode 1370 of an individual memory cell MC20. In some embodiments, the via openings 1384 connected to a same trench 1382 reach memory cells MC20 disposed on different conductive lines 1310.

Figure 19G:
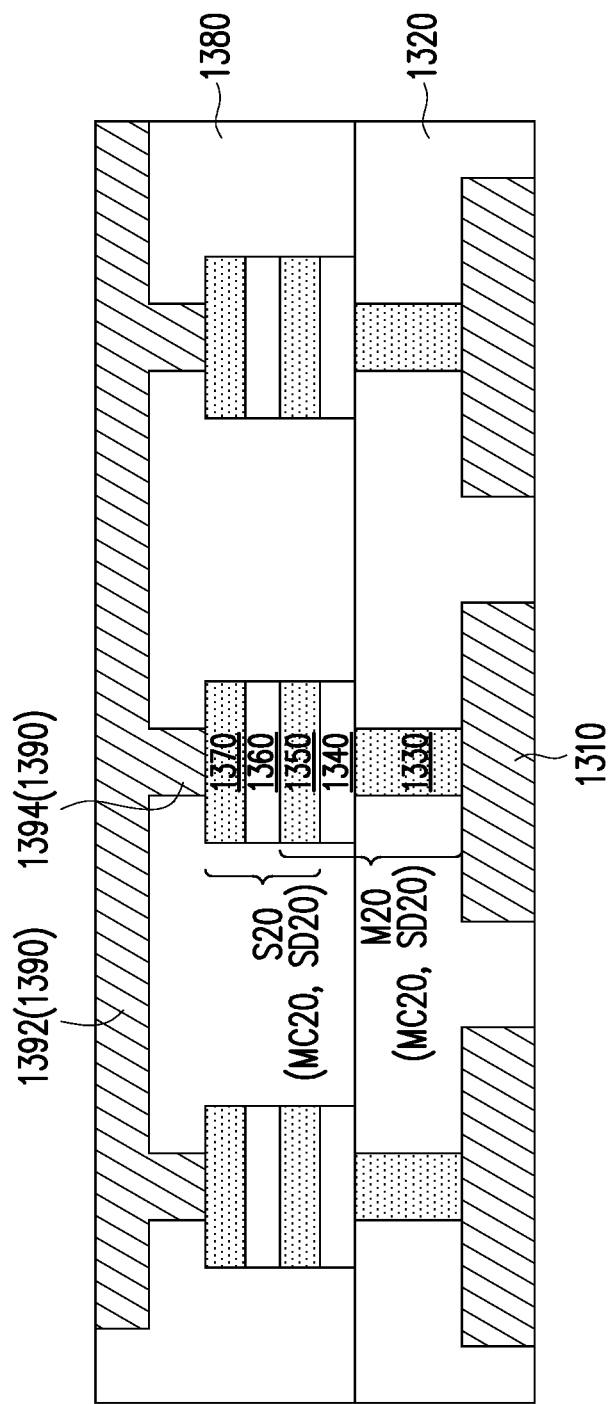

In FIG. 19G, the trenches 1382 and the via openings 1384 are filled with a conductive material, to form conductive patterns 1390 including the conductive lines 1392 and conductive vias 1394 connecting the conductive lines 1392 to the memory cells MC20. The conductive material may be formed by any suitable deposition technique, such as sputtering or plating. In some embodiments, the conductive material may be formed by a dual damascene process. In some alternative embodiments, the conductive vias 1394 may be omitted, and the conductive lines 1392 may be formed directly on the top electrodes 1370. In some alternative embodiments, the ILD 1380 may be planarized to reach the same level height as the top electrodes 1370, and the conductive lines 1392 may be formed on the ILD 1380 and the top electrodes 1370.

Figure 20A:
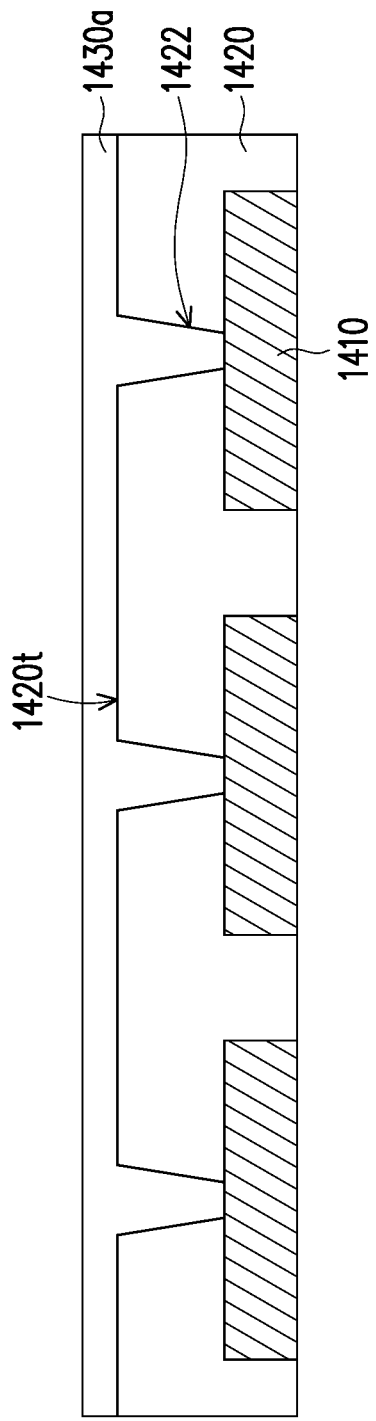
FIG. 20A to FIG. 20C are schematic cross-sectional views of structures formed during a manufacturing method of a semiconductor device according to some embodiments of the disclosure.
Figure 20B:
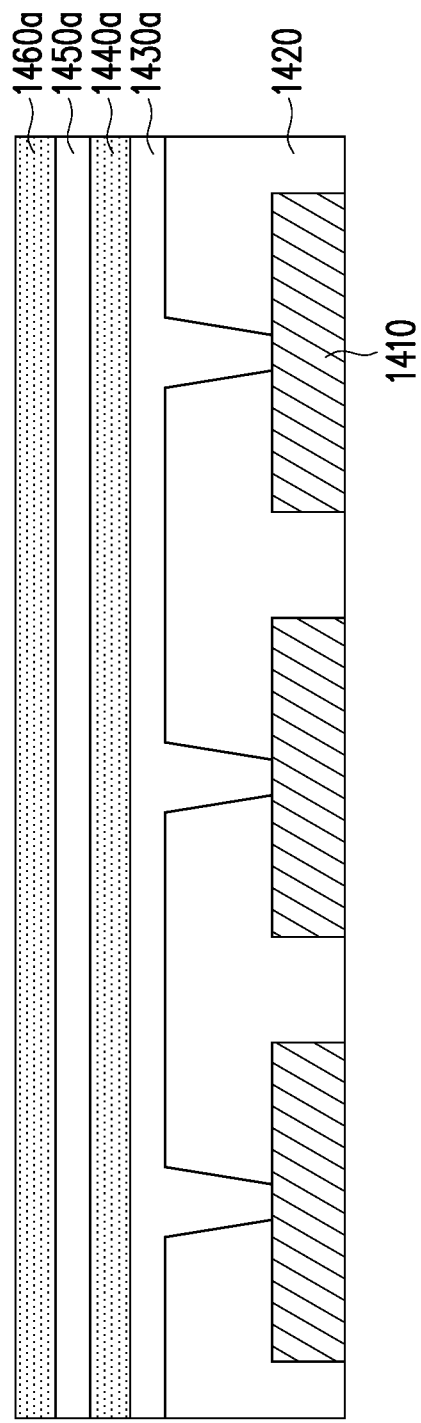
Figure 20C:
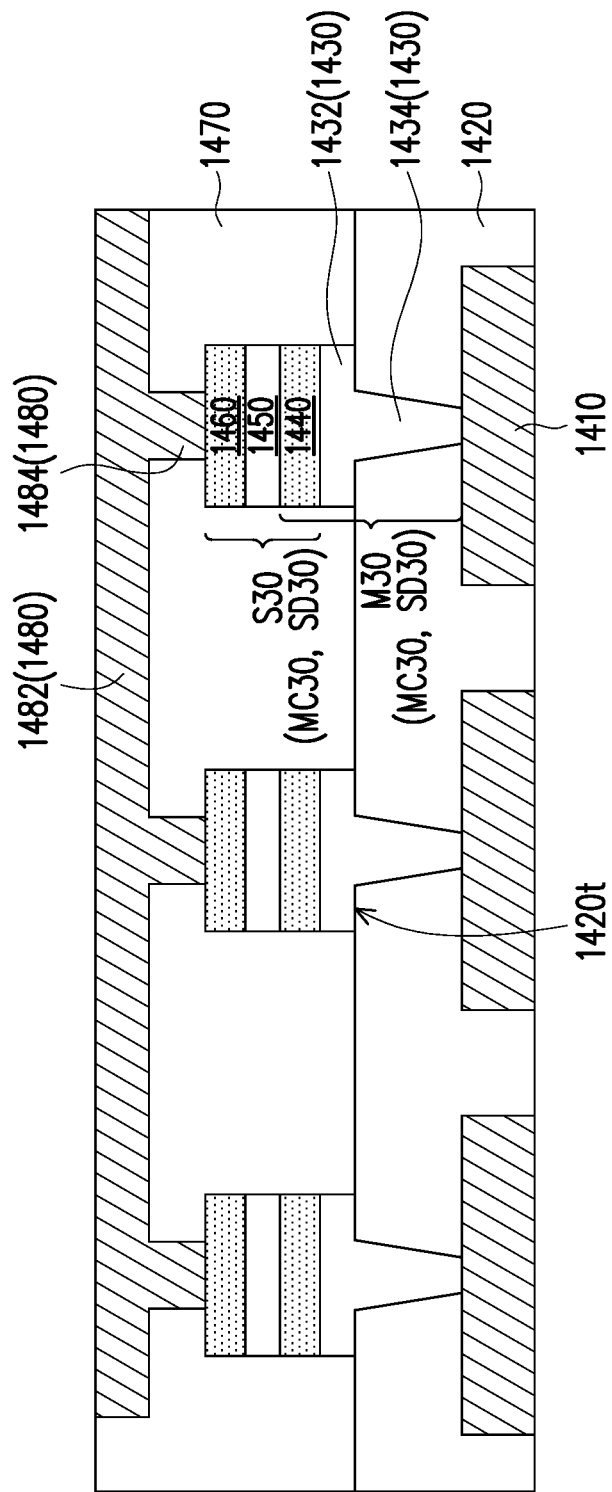

In some alternative embodiments, memory cells MC30 of a semiconductor device SD30 may be formed with a confined configuration as illustrated, for example, in FIG. 20A to FIG. 20C. Briefly, conductive lines 1410 similar to the conductive lines 160 of FIG. 1 may be encapsulated in an ILD 1420, as illustrated in FIG. 20A. The ILD 1420 may include via openings 1422 exposing at their bottom the conductive lines 1410. Each opening 1422 exposes one conductive line 1410, and multiple openings 1422 may be expose a same conductive line 1410. The openings 1422 are formed at the desired location of the later formed memory cells. In some embodiments, the openings 1422 may have tapered sidewalls. A memory material layer 1430a is formed filling the openings 1422 and extending on the top surface 1420t of the ILD 1420. In some embodiments, the memory material layer 1430a includes a phase change material. In some embodiments, the tapered sidewalls may facilitate proper gap filling, reducing or preventing voids in the memory material layer.

In FIG. 20B, a layer stack including the middle electrode material layer 1440a, the switch material layer 1450a, and the top electrode material layer 1460a are formed on the memory material layer 1430a, with similar processes and materials as previously described with reference to FIG. 13A. The switch material layer 1450a includes a ternary GeCTe material according to the disclosure.

The structure of FIG. 20C may be obtained from the structure of FIG. 20B following process steps similar to the ones previously described with reference from FIG. 19E to FIG. 19G. Briefly, the stacked layers are patterned to form individual memory cells MC30 on the conductive lines 1410. The memory cells MC30 include memory elements M30 and switches S30 stacked on the memory elements M30. A memory layer 1430 of the memory elements M30 has a layer portion 1432 extending on a top surface 1420t of the ILD 1420 and a via portion 1434 extending through the ILD 1420 to directly contact the conductive lines 1410. The middle electrode 1440, the switch layer 1450 and the top electrode 1460 stacked on the memory layer 1430 may have a substantially equal footprint to the layer portion 1432 of the memory layer 1430. The ILD 1470 is formed on the ILD 1420 to encapsulate the layer portion 1432 of the memory layer 1430, and the overlying middle electrode 1440, selector layer 1450 and top electrode 1460. The memory cells MC30 are contacted by the conductive lines 1482, which may be part of conductive patterns 1480. Conductive vias 1484 may be optionally formed to electrically connect the conductive lines 1482 to the top electrodes 1460 of the memory cells MC30. In some alternative embodiments, the conductive vias 1484 may be skipped, and the conductive lines 1482 may be directly formed on the top electrodes 1460 of the memory cells MC30.

It will be apparent that the pillar, mushroom, and confined configurations described above for the memory cells MC10, MC20, MC30 are only non-limiting examples, and that other configurations may be adopted and are contemplated within the scope of the disclosure. In some embodiments, the selectors and the memory elements may be formed separately, for example, in different tiers of the interconnection structure. In some alternative embodiments, the memory elements may be skipped. In some embodiments, the configurations and processes described above for the memory cells MC10, MC20, MC30 may be adapted to form switches separately, and possibly independently, of the memory elements. For example, in FIG. 21A and FIG. 21B is schematically illustrated the formation of switches S40 having a pillar configuration. The manufacturing process may be similar to the one described above with reference to FIG. 12A to FIG. 18B, skipping the formation of the components of the memory element. For example, as illustrated in FIG. 21A, on conductive lines 1510 and the ILD 1520 a stack including a bottom electrode material layer 1530a, a switch material layer 1540a and a top electrode material layer 1550a is formed. The switch material layer 1540a includes a ternary GeCTe material according to the disclosure.

The stacked layers may be patterned to form an array of pillars corresponding to individual switches S40, each pillar comprising a bottom electrode 1530, a selector layer 1540, and a top electrode 1550. The ILD 1560 is then formed on the ILD 1520 to laterally wraps the pillar switches S40, exposing the top surfaces of the top electrodes 1550. Conductive lines 1570 are then formed on the ILD 1560 to contact the top electrodes 1550 of the switches S40. In some embodiments, the semiconductor device SD40 including the switches S40 may include separate memory elements (not shown) connected to corresponding switches S40, for example through the conductive lines 1510. In some alternative embodiments, the memory elements may be omitted entirely, and the switches S40 may be simply integrated within larger functional circuits.

Figure 22C:
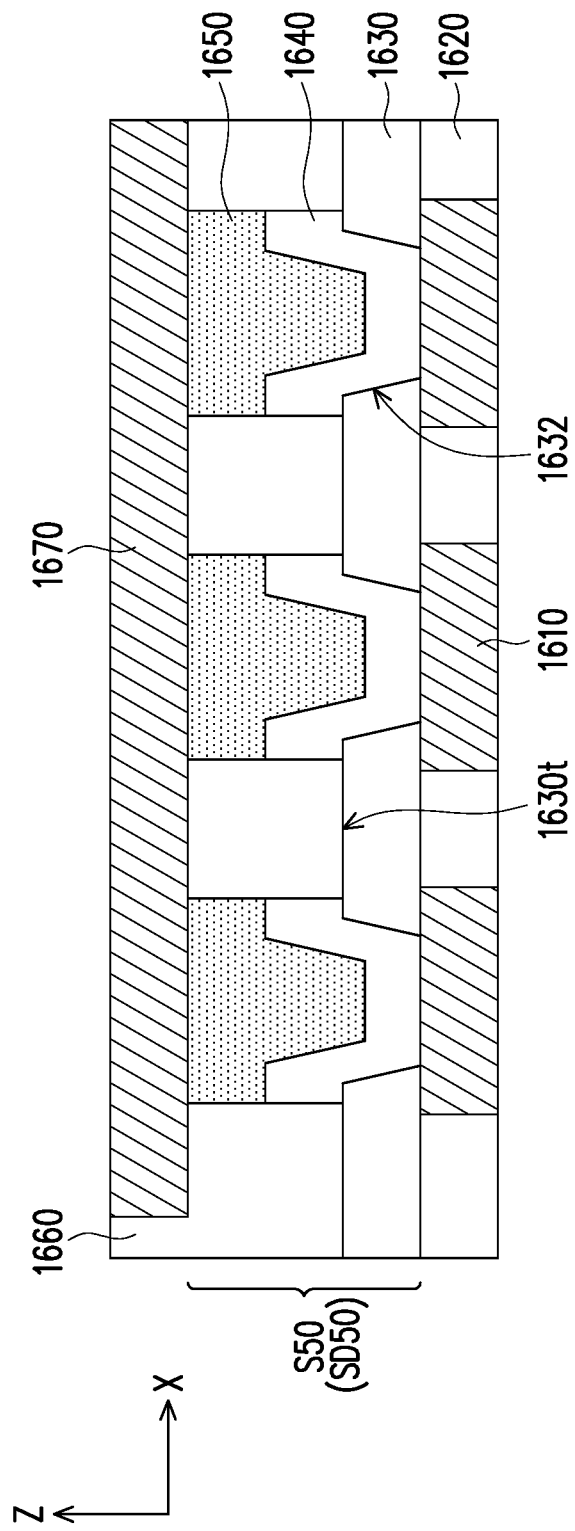

As for the memory cells, the disclosure does not limit the possible configurations of the switches. For example, in FIG. 22A to FIG. 22C is schematically illustrated the manufacturing of switches S50 having a recessed configuration. The manufacturing process may be similar to the one described above with reference to FIG. 20A to FIG. 20C, skipping the formation of the components of the memory element. For example, as illustrated in FIG. 22A, on the conductive lines 1610 embedded in the ILD 1620 is formed an ILD 1630 including openings 1632. The switch material layer 1640a is conformally disposed on the ILD 1630, extending on the top surface 1630t of the ILD 1630 and on the sidewalls and at the bottom of the openings 1632, where the switch material layer 1640a contacts the conductive lines 1610. In some embodiments, the switch material layer 1640a may have a substantially uniform thickness along the Z direction, so that recesses 1642 are formed where the switch material layer 1640a extends within the openings 1630. The switch material layer 1640a includes a ternary GeCTe material according to the disclosure.

In FIG. 22B a top electrode material layer 1650a is formed on the top surface 1640t of the switch material layer 1640a, and also filling the recesses 1642. In some embodiments, a planarization process may be performed after forming the top electrode material layer 1650a, so that the top surface 1650t of the top electrode material layer 1650a is substantially flat. That is, the top electrode material layer 1650a may include thicker portions in correspondence of the recesses 1642.

Referring to FIG. 22B and FIG. 22C, the switch material layer 1640a and the top electrode material layer 1650a are patterned to respectively form the switch layers 1640 and the top electrodes 1650 of the switches S50. The switch layer 1640 may extend within the openings 1632 and on the top surface 1630t of the ILD 1630 surrounding the openings 1632. The top electrode 1650 has substantially a similar footprint as the switch layer 1640. The switches S50 may be wrapped in the ILD 1660, and the conductive lines 1670 may be formed in trenches of the ILD 1660 to contact the switches S50. As illustrated in the case of the semiconductor device SD50, the switches of the disclosure need not include multiple electrode layers, as in the switches S50 including only the top electrode 1650.

In some alternative embodiments, the switches may have a mushroom configuration, as is the case for the switches S60 of the semiconductor device SD60 of FIG. 23A and FIG. 23B. The switches S60 may be formed following a similar process as previously described with reference to FIG. 19A to FIG. 19G. Briefly, an ILD 1730 is formed on conductive lines 1710 embedded in an ILD 1720. Bottom electrodes 1740 are formed within openings 1732 of the ILD 1730, similar to what was previously discussed with reference to FIG. 19A to FIG. 19C. Thereafter, a switch material layer 1750a and a top electrode layer 1760a are formed on the ILD 1730 and the switches 1740. The switch material layer 1750a includes a ternary GeCTe material according to the disclosure. The switch material layer 1750a and the top electrode layer 1760a are then patterned to form the switch layer 1750 and the top electrode 1760. The switch layer 1750 covers the underlying bottom electrode 1740 and further extends in the top surface 1730t of the dielectric 1730 in the surroundings of the bottom electrode 1740. The top electrode 1760 has a substantially equal footprint to the underlying switch layer 1750. An ILD 1770 is then formed on the ILD 1730 to encircle the switch layers 1750 and the top electrodes 1760. In some embodiments, the top surfaces of the top electrodes 1760 are exposed by the ILD 1770. Conductive lines 1780 are then formed on the ILD 1770 (in some cases, in trenches of the ILD 1770) to contact the switches S60.

In accordance with some embodiments of the disclosure, a semiconductor device includes a semiconductor substrate and an interconnection structure. The interconnection structure is disposed over the semiconductor substrate. The interconnection structure includes first conductive lines, second conductive lines, and ovonic threshold switches. The first conductive lines extend parallel to each other in a first direction. The second conductive lines are stacked over the first conductive lines and extend parallel to each other in a second direction perpendicular to the first direction. The ovonic threshold switches are disposed between the first conductive lines and the second conductive lines. The ovonic threshold switches include a ternary GeCTe material. The ternary GeCTe material consists substantially of carbon, germanium, and tellurium. In the ternary GeCTe material, a content of carbon is in a range from 10 to 30 atomic percent and a content of germanium is in a range from 10 to 65 atomic percent.

In accordance with some embodiments of the disclosure, a semiconductor device includes a semiconductor substrate and a memory tier. The memory tier is disposed over the semiconductor substrate. The memory tier includes middle electrodes and paired switch layers and memory layers. In the pairs, the switch layers and the memory layers are vertically stacked. The middle electrodes are disposed between the memory layers and the switch layers. The switch layers include a ternary material comprising carbon, germanium and tellurium. In the ternary material, a content of carbon is in a range from 10 to 30 atomic percent. A content of germanium is in a range from 10 to 65 atomic percent. A content of tellurium is in a range from 25 to 80 atomic percent.

In accordance with some embodiments of the disclosure, a manufacturing method of a semiconductor device includes the following steps. A ternary GeCTe material is formed on a substrate. Forming the ternary GeCTe material includes applying a first power to a first sputtering target and applying a second power to a second sputtering target. A material of the first sputtering target is selected from elemental carbon, elemental germanium, elemental tellurium, and a combination thereof. A material of the second sputtering target includes a mixture of elements selected from carbon, germanium, and tellurium. In the ternary GeCTe material, a content of carbon is in a range from 15 to 30 atomic percent, a content of germanium is in a range from 10 to 40 atomic percent, and a content of tellurium is in a range from 40 to 70 atomic percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor substrate and an interconnection structure disposed over the semiconductor substrate, wherein the interconnection structure comprises:
first conductive lines extending parallel to each other in a first direction;

second conductive lines stacked over the first conductive lines and extending parallel to each other in a second direction perpendicular to the first direction; and ovonic threshold switches, disposed between the first conductive lines and the second conductive lines, wherein the ovonic threshold switches comprise a ternary GeCTe material, the ternary GeCTe material substantially consists of germanium, carbon, and tellurium, and is free of Selenium (Se), and in the ternary GeCTe material, a content of carbon is in a range from 10 to 30 atomic percent and a content of germanium is in a range from 10 to 65 atomic percent.

2. The semiconductor device of claim 1, wherein the interconnection structure further comprises:

memory elements disposed in between the first conductive lines and the second conductive lines and connected in series to corresponding ones of the ovonic threshold switches.

3. The semiconductor device of claim 2, wherein the memory elements include a phase change material, and the interconnection structure further comprises middle electrodes disposed between the ternary GeCTe material and the phase change material, wherein the ternary GeCTe material contacts first sides of the middle electrodes, and the phase change material contacts second sides of the middle electrodes opposite to the first sides.

4. The semiconductor device of claim 3, wherein the ovonic threshold switches are disposed over the memory elements, and the phase change material directly contacts the first conductive lines.

5. The semiconductor device of claim 1, wherein the interconnection structure further comprises:

bottom electrodes disposed between the ovonic threshold switches and the first conductive lines and top electrodes disposed between the ovonic threshold switches and the second conductive lines, wherein footprints of the ovonic threshold switches are larger than footprints of the underlying bottom electrodes.

6. The semiconductor device of claim 1, wherein the interconnection structure further comprises:

bottom electrodes disposed between the ovonic threshold switches and the first conductive lines and top electrodes disposed between the ovonic threshold switches and the second conductive lines, wherein footprints of the ovonic threshold switches match in size and are aligned with footprints of the underlying bottom electrodes.

7. The semiconductor device of claim 1, wherein, in the ternary GeCTe material, a germanium content is in a range from 12 atomic percent to 21 atomic percent, a carbon content is in a range from 22 atomic percent to 25 atomic percent, and a tellurium content is in a range from 56 atomic percent to 66 atomic percent.

8. A semiconductor device, comprising:

a semiconductor substrate, and a memory tier disposed over the semiconductor substrate, wherein the memory tier comprises:

paired switch layers and memory layers, wherein, in the pairs, the switch layers and the memory layers are vertically stacked; and middle electrodes disposed between the memory layers and the switch layers, wherein the switch layers comprise a ternary material comprising carbon, germanium, and tellurium, and, in the ternary material, a content of carbon is in a range from 10 to 30 atomic percent, a content of germanium is in a range from 10 to 65 atomic percent, and a content of tellurium is in a range from 25 to 80 atomic percent, and a sum of the content of carbon, the content of germanium and the content of tellurium in the ternary material is 98.4 atomic percent or more.

9. The semiconductor device of claim 8, wherein the content of carbon in the ternary material is in a range from 15 to 30 atomic percent.

10. The semiconductor device of claim 9, wherein the content of tellurium in the ternary material is in a range from 40 to 70 atomic percent, and the content of germanium in the ternary material is in a range from 10 to 40 atomic percent.

11. The semiconductor device of claim 8, wherein the content of carbon in the ternary material is in a range from 20 to 26 atomic percent.

12. The semiconductor device of claim 11, wherein the content of germanium in the ternary material is in a range from 10 to 22 atomic percent.

13. The semiconductor device of claim 8, wherein an oxygen content in the ternary material is 0.5 atomic percent or less.

14. The semiconductor device of claim 8, wherein the memory tier further comprises top electrodes and bottom electrodes disposed at opposite sides of the paired switch layers and memory layers.

15. A manufacturing method of a semiconductor device, comprising:

providing a semiconductor substrate and forming an interconnection structure disposed over the semiconductor substrate, wherein forming the interconnection structure comprises:

forming first conductive lines extending parallel to each other in a first direction;

forming second conductive lines stacked over the first conductive lines and extending parallel to each other in a second direction perpendicular to the first direction; and forming ovonic threshold switches disposed between the first conductive lines and the second conductive lines, wherein forming the ovonic threshold switches comprise forming a ternary GeCTe material on a support substrate in between the first conductive lines and the second conductive lines of the interconnection structure, wherein forming the ternary GeCTe material comprises:

applying a first power to a first sputtering target and applying a second power to a second sputtering target, wherein a material of the first sputtering target is selected from elemental carbon, elemental germanium, elemental tellurium, and a combination thereof, a material of the second sputtering target includes a mixture of elements selected from carbon, germanium, and tellurium, and in the ternary GeCTe material, which substantially consists of germanium, carbon, and tellurium, and is free of Selenium (Se), a content of carbon is in a range from 10 to 30 atomic percent, and a content of germanium is in a range from 10 to 65 atomic percent.

16. The manufacturing method of claim 15, wherein a temperature of the support substrate is in a range from 25° C. to 50° C. and a sputtering pressure is in a range from 0.3 mTorr to 3 mTorr.

17. The manufacturing method of claim 15, wherein the first sputtering target is a germanium target and the second sputtering target is a CTe target.

18. The manufacturing method of claim 17, wherein the first power is applied as direct current in a range from 15 W to 100 W and the second power is applied as alternated current in a range from 300 W to 900 W.

19. The manufacturing method of claim 17, wherein forming the ternary GeCTe material comprises applying a third power to a third sputtering target, and the third sputtering target is a tellurium target.

20. The manufacturing method of claim 15, wherein the support substrate comprises a phase change material and a conductive material disposed on the phase change material, and the ternary GeCTe material is formed on the conductive material.

* * * * *